(12) United States Patent
Dozen et al.

(10) Patent No.: US 7,785,933 B2
(45) Date of Patent: Aug. 31, 2010

(54) METHOD FOR MANUFACTURING SEMICONDUCTOR DEVICE

(75) Inventors: Yoshitaka Dozen, Tochigi (JP); Eiji Sugiyama, Tochigi (JP); Hisashi Ohtani, Tochigi (JP); Takuya Tsurume, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/076,148

(22) Filed: Mar. 14, 2008

(65) Prior Publication Data

US 2008/0311706 A1    Dec. 18, 2008

(30) Foreign Application Priority Data

Mar. 26, 2007  (JP) ............................. 2007-079264

(51) Int. Cl.
  *H01L 21/16*    (2006.01)
(52) U.S. Cl. ................ 438/127; 438/106; 438/107; 438/110; 257/E21.502
(58) Field of Classification Search ........... 438/127, 438/106, 758, 778, 780, 781, 107, 110; 257/E21.502
See application file for complete search history.

(56) References Cited

U.S. PATENT DOCUMENTS

| | | | |
|---|---|---|---|
| 5,075,166 A | 12/1991 | Sikorski et al. |
| 5,597,631 A | 1/1997 | Furumoto et al. |
| 5,757,456 A | 5/1998 | Yamazaki et al. |
| 5,770,313 A | 6/1998 | Furumoto et al. |
| 5,821,138 A | 10/1998 | Yamazaki et al. |
| 5,879,502 A | 3/1999 | Gustafson |
| 5,888,609 A | 3/1999 | Karttunen et al. |
| 6,224,965 B1 | 5/2001 | Haas et al. |
| 6,403,221 B1 | 6/2002 | Nakamura et al. |
| 6,476,330 B2 | 11/2002 | Otsuka et al. |
| 6,482,495 B1 | 11/2002 | Kohama et al. |
| 6,530,147 B1 | 3/2003 | Haas et al. |

(Continued)

FOREIGN PATENT DOCUMENTS

EP    1092739 A    4/2001

(Continued)

OTHER PUBLICATIONS

Search Report (Application No. 08004496.9) Dated Apr. 14, 2009.

*Primary Examiner*—Thomas L Dickey
*Assistant Examiner*—Nikolay Yushin
(74) *Attorney, Agent, or Firm*—Eric J. Robinson; Robinson Intellectual Property Law Office, P.C.

(57) ABSTRACT

To provide a method for manufacturing a highly-reliable semiconductor device, which is not damaged by external local pressure, with a high yield, a semiconductor device is manufactured by forming an element substrate having a semiconductor element formed using a single-crystal semiconductor substrate or an SOI substrate, providing the element substrate with a fibrous body formed from an organic compound or an inorganic compound, applying a composition containing an organic resin to the element substrate and the fibrous body so that the fibrous body is impregnated with the organic resin, and heating to provide the element substrate with a sealing layer in which the fibrous body formed from an organic compound or an inorganic compound is contained.

27 Claims, 14 Drawing Sheets

U.S. PATENT DOCUMENTS

| | | |
|---|---|---|
| 6,805,958 B2 | 10/2004 | Nakamura et al. |
| 6,903,377 B2 | 6/2005 | Yamazaki et al. |
| 6,926,794 B2 | 8/2005 | Kohama et al. |
| 7,049,178 B2 | 5/2006 | Kim et al. |
| 7,061,083 B1 | 6/2006 | Usami et al. |
| 7,067,392 B2 | 6/2006 | Yamazaki et al. |
| 7,262,464 B2 | 8/2007 | Takafuji et al. |
| 7,465,674 B2 | 12/2008 | Tamura et al. |
| 7,485,489 B2 | 2/2009 | Bjorbell |
| 2001/0010272 A1 | 8/2001 | Otsuka et al. |
| 2003/0032210 A1 | 2/2003 | Takayama et al. |
| 2004/0016118 A1 | 1/2004 | Haas et al. |
| 2005/0233122 A1 | 10/2005 | Nishimura et al. |
| 2006/0105153 A1 | 5/2006 | Jang et al. |
| 2006/0110863 A1 | 5/2006 | Yamamoto et al. |
| 2007/0004125 A1 | 1/2007 | Watanabe et al. |
| 2007/0020932 A1 | 1/2007 | Maruyama et al. |
| 2007/0054443 A1 | 3/2007 | Shimomura |
| 2007/0278563 A1 | 12/2007 | Takano et al. |
| 2008/0012126 A1 | 1/2008 | Dozen et al. |
| 2008/0044940 A1 | 2/2008 | Watanabe et al. |
| 2008/0224940 A1* | 9/2008 | Sugiyama et al. ........... 343/873 |
| 2008/0224941 A1* | 9/2008 | Sugiyama et al. ........... 343/873 |
| 2008/0242005 A1* | 10/2008 | Dozen et al. ................. 438/127 |

FOREIGN PATENT DOCUMENTS

| | | |
|---|---|---|
| EP | 1589797 A | 10/2005 |
| JP | 05-190582 | 7/1993 |
| JP | 05-286065 | 11/1993 |
| JP | 07-007246 A | 1/1995 |
| JP | 10-092980 A | 4/1998 |
| JP | 2001-331120 | 11/2001 |
| JP | 2003-049388 | 2/2003 |
| JP | 2004-078991 | 3/2004 |
| JP | 2004-362341 | 12/2004 |
| JP | 2007-091822 | 4/2007 |
| WO | WO-96/09158 | 3/1996 |
| WO | WO-01/01740 A | 1/2001 |
| WO | WO-04/001848 | 12/2003 |

* cited by examiner

METHOD FOR MANUFACTURING SEMICONDUCTOR DEVICE

BACKGROUND OF THE INVENTION

1. Field of the Invention

The present invention relates to a method for manufacturing a semiconductor device having a semiconductor element formed using a single-crystal semiconductor substrate or an SOI substrate.

2. Description of the Related Art

Currently, it is important to make various devices, such as wireless chips and sensors, into a thinner shape in miniaturizing products, and the technique and the application range spread rapidly. Such various devices which are made thin are flexible to some extent and thus the devices can be provided for an object having a curved surface.

In Reference 1 (Japanese Published Patent Application No. 2004-78991), a semiconductor device is disclosed in which, a semiconductor chip with the size of less than or equal to 0.5 mm is embedded in paper or a film-like medium, so that tolerance for bending and concentrated loading is improved.

SUMMARY OF THE INVENTION

However, in the case of a semiconductor device with a built-in (on-chip) antenna which is incorporated in a chip, the size of the antenna is small when the area occupied by the chip is small, leading to a problem of a short communication distance. In the case where a semiconductor device is manufactured such that an antenna provided on a paper or a film medium is connected to a chip, poor connection is made and yield is reduced when the size of the chip is small.

In view of the above, the present invention provides a method for manufacturing a highly-reliable semiconductor device, which is not damaged by external local pressure, with a high yield.

It is an aspect of the present invention that a semiconductor device is manufactured by forming an element substrate having a semiconductor element formed using a single-crystal semiconductor substrate or an SOI substrate, providing the element substrate with a fibrous body formed from an organic compound or an inorganic compound, applying a composition containing an organic resin to the element substrate and the fibrous body so that the fibrous body is impregnated with the organic resin, and heating to provide the element substrate with a sealing substrate containing the fibrous body formed from an organic compound or an inorganic compound.

It is another aspect of the present invention that a semiconductor device is manufactured by forming an element substrate having a semiconductor element formed using a single-crystal semiconductor substrate or an SOI substrate, applying a composition containing an organic resin to the element substrate, providing a fibrous body formed from an organic compound or an inorganic compound over the element substrate and the organic resin so that the fibrous body is impregnated with the organic resin, and heating to provide the element substrate with a sealing substrate containing the fibrous body formed from an organic compound or an inorganic compound.

The thickness of the element substrate is preferably greater than or equal to 1 μm and less than or equal to 80 μm, more preferably greater than or equal to 1 μm and less than or equal to 50 μm, greater than or equal to 1 μm and less than or equal to 20 μm, and still more preferably greater than or equal to 1 μm and less than or equal to 10 μm, or greater than or equal to 1 μm and less than or equal to 5 μm. The thickness of the sealing layer is preferably greater than or equal to 10 μm and less than or equal to 100 μm. With such thicknesses, a semiconductor device which can be curved can be manufactured.

The fibrous body is a woven fabric or a nonwoven fabric which uses high-strength fiber of an organic compound or an inorganic compound. The high-strength fiber is specifically fiber with a high elongation modulus or fiber with a high Young's modulus.

Further, as the organic resin, a thermoplastic resin or a thermosetting resin can be used.

Using high-strength fiber as the fibrous body, even when local pressure is applied to a semiconductor device, the pressure is dispersed throughout the fibrous body; accordingly, partial stretching of the semiconductor device can be prevented. That is, destruction of a wiring, a semiconductor element, or the like which is caused by partial stretching thereof, can be prevented.

In accordance with the present invention, a highly-reliable semiconductor device which is not easily damaged by external local pressure can be manufactured with high yield.

DETAILED DESCRIPTION OF THE INVENTION

Embodiment Mode

Figure 1A:
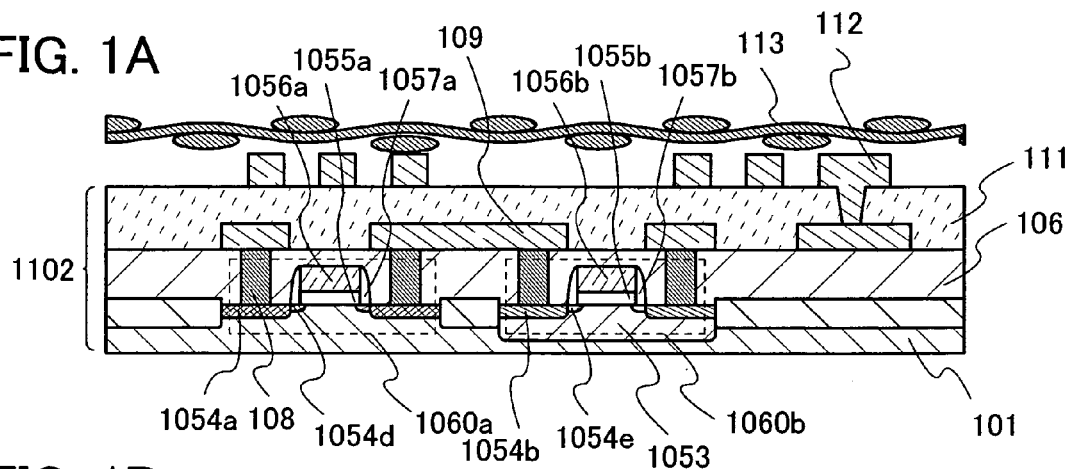
FIGS. 1A to 1D are cross-sectional views illustrating a manufacturing method of a semiconductor device of the present invention.

Embodiment Modes of the present invention will be explained below with reference to the accompanying drawings. However, the present invention can be implemented in various different modes, and it will be readily appreciated by those skilled in the art that various changes and modifications of the modes and details are possible, unless such changes and modifications depart from the content and the scope of the invention. Therefore, unless such changes and modifications depart from the scope of the invention, they should be construed as being included therein. Note that identical portions or portions having the same function in all figures for explaining embodiment modes are denoted by the same reference numerals and detailed descriptions thereof are omitted.

Embodiment Mode 1

In this embodiment mode, a method of manufacturing a semiconductor device which is not easily damaged by external local pressure with high yield will be described with reference to FIGS. 1A to 1D.

As shown in FIG. 1A, an antenna 112 and an element substrate 1102 having a semiconductor element formed using a single-crystal semiconductor substrate or an SOI substrate are formed. Next, a fibrous body 113 is provided over the element substrate 1102 and the antenna 112.

As typical examples of a semiconductor element included in the semiconductor substrate 1102, an active element such as a MOS transistor, a diode, or a nonvolatile memory element, and a passive element such as a resistor element or a capacitor element can be given. As a single-crystal semiconductor substrate, a single-crystal silicon substrate having n-type or p-type conductivity (a silicon wafer), or a compound semiconductor substrate (e.g., a GaAs substrate, an InP substrate, a GaN substrate, an SiC substrate, a sapphire substrate, or a ZnSe substrate) is preferably used. Alternatively, an SOI (Silicon On Insulator) substrate may be used. As the SOI substrate, the following substrate may be used: a so-called SIMOX (separation by implanted oxygen) substrate which is formed in such a manner that after an oxygen ion is implanted into a mirror-polished wafer, an oxide layer is formed at a certain depth from the surface by high-temperature annealing and eliminating defects generated in a surface layer, or an SOI substrate formed by using a technique called a Smart-Cut method in which an Si substrate is cleaved by utilizing growth of a minute void, which is formed by implantation of a hydrogen ion, by thermal treatment; an ELTRAN (epitaxial layer transfer: a registered trademark of Canon Inc.) method; or the like. The thickness of the element substrate 1102 is preferably greater than or equal to 1 μm and less than or equal to 80 μm, more preferably greater than or equal to 1 μm and less than or equal to 50 μm, still more preferably greater than or equal to 1 μm and less than or equal to 20 μm, still more preferably greater than or equal to 1 μm and less than or equal to 10 μm, still more preferably greater than or equal to 1 μm and less than or equal to 5 μm. When the element substrate is formed to have such a thickness, a semiconductor device capable of being curved can be manufactured. The area of a top surface of the semiconductor device is preferably greater than or equal to 4 mm$^2$, more preferably greater than or equal to 9 mm$^2$.

When at least a MOS transistor, a resistor, a capacitor element, a wiring and the like are formed in the element substrate 1102, a microprocessor (MPU) which controls other devices and calculates and processes data can be manufactured. The MPU includes a CPU, a main memory, a controller, an interface, an I/O port, and the like.

Further, in a case where at least a memory element and a MOS transistor is formed in the element substrate 1102, a memory device can be manufactured as a semiconductor device. As the memory element, a nonvolatile memory element including a floating gate or a charge storage layer; a MOS transistor and a capacitor element connected to the MOS transistor; a MOS transistor and a capacitor element including a ferroelectric layer which is connected to the MOS transistor, an organic memory element in which an organic compound layer is interposed between a pair of electrodes; or the like can be given. As semiconductor devices having such memory elements, memory devices such as DRAM (Dynamic Random Access Memory), SRAM (Static Random Access Memory), FeRAM (Ferroelectric Random Access Memory), mask ROM (Read Only Memory), EPROM (Electrically Programmable Read Only Memory), EEPROM (Electrically Erasable and Programmable Read Only Memory), and flash memory can be given.

In a case where at least a diode is formed in the element substrate 1102, a light sensor, an image sensing, a solar battery, or the like can be manufactured as a semiconductor device. As a diode, a photodiode such as a PN diode, a PIN diode, an avalanche diode, or a Schottky diode, or the like can be given.

Further, in a case where a MOS transistor which is at least included in the element substrate 1102 is formed and an antenna electrically connected to the MOS transistor is formed over the element substrate 1102; as a semiconductor device, an ID tag, an IC tag, an RF (Radio Frequency) tag, a wireless tag, an electronic tag, an RFID (Radio Frequency Identification) tag, an IC card, an ID card, or the like (hereinafter referred to as RFID), which can communicate data wirelessly can be manufactured. Note that a semiconductor device of the present invention includes an inlet in which an integrated circuit portion formed from a MOS transistor or the like and an antenna are sealed, or such an inlet which is formed into a seal shape or a card shape. When the area of the top face of the RFID is 4 mm$^2$ or more, further 9 mm$^2$ or more, the antenna can be formed with a large size, so that an RFID having a long communication distance with respect to a communication instrument can be manufactured.

Further, here, in the element substrate 1102 including a semiconductor element formed using a single-crystal semiconductor substrate or an SOI substrate, the following are shown: the MOS transistors 1060a and 1060b; an insulating layer 106 which covers the MOS transistors 1060a and 1060b; conductive layers 108 and 109 which are connected to a source region and a drain region in the MOS transistor 1060a and to a source region or a drain region in a well region of the MOS transistor 1060b, through the insulating layer 106; and an insulating layer 111 which covers the conductive layers 108 and 109 and part of the insulating layer 106. The antenna 112 connected to the conductive layer 109 through the insulating layer 111 is formed over the element substrate 1102.

MOS transistor 1060a at least includes a semiconductor substrate 101, impurity regions 1054a, a gate insulating layer 1055a, and a gate electrode 1056a. Further, the MOS transistor 1060b includes a well region, impurity regions 1054b a gate insulating layer 1055b, and a gate electrode 1056b. If the semiconductor substrate 101 is n-type, a p-well region 1053 into which a p-type impurity has been injected is formed as the well region. As the p-type impurity, for example, boron may be added at a concentration of approximately $5 \times 10^{15}$ cm$^{-3}$ to $1 \times 10^{16}$ cm$^{-3}$. The provision of the p-well region 1053 makes it possible to form an n-channel transistor therein. Further, the p-type impurity added to the p-well region 1053 has a function of controlling the threshold voltage of the MOS transistor. Channel formation regions to be formed in the semiconductor substrate 101 and the p-well region 1053 are formed in regions which are approximately aligned with the gate electrodes 1056a and 1056b, respectively, and placed between pairs of impurity regions 1054a and 1054d formed in the semiconductor substrate 101, and pairs of impurity regions 1054b and 1054e formed in the p-well region 1053, respectively.

The pairs of impurity regions 1054a and 1054b are regions serving as sources and drains in the MOS transistors. The pairs of impurity regions 1054a and 1054b are formed by doping with phosphorus or arsenic which are n-type impurities and boron that is a p-type impurity, respectively at a peak concentration of approximately $10^{21}$ cm$^{-3}$.

Spacers 1057a and 1057b are formed on sidewalls of the gate electrodes 1056a and 1056b, respectively. When the spacers 1057a and 1057b are formed, an advantageous effect is obtained in that leakage current at edges of the gate electrodes 1056a and 1056b is prevented. In addition, with the use of the spacers 1057a and 1057b, the low concentration impurity regions 1054d and 1054e can be formed under both edges of the gate electrodes 1056a and 1056b in a channel length direction, respectively. Each of the low concentration impurity regions 1054d and 1054e serves as a lightly doped drain (LDD). The low concentration impurity regions 1054d and 1054e are not necessarily formed; however, when these regions are provided, an electric field of an edge of a drain can be moderated and deterioration of the MOS transistor can be suppressed.

The gate insulating layers 1055a and 1055b can be formed of, for example, silicon oxide films obtained by oxidizing a surface of the semiconductor substrate 101 with thermal treatment. Alternatively, the gate insulating layers 1055a and 1055b may be formed with a structure having a stack of a silicon oxide film and a film containing oxygen and nitrogen (a silicon oxynitride film) by forming the silicon oxide film with a thermal oxidation method and then nitriding the surface of the silicon oxide film with nitridation treatment. The gate insulating layers 1055a and 1055b are formed from an inorganic insulator such as a silicon oxide or a silicon nitride oxide to a thickness of 5 nm to 50 nm.

It is preferable that the gate electrodes 1056a and 1056b be formed of metal selected from tantalum (Ta), tungsten (W), titanium (Ti), molybdenum (Mo), chromium (Cr), niobium (Nb), and the like, or an alloy material or compound material containing any of the elements as its main component. Alternatively, polycrystalline silicon to which an impurity element such as phosphorus is added can be used. Further alternatively, a control gate electrode may be formed with a layered structure having a stack of one or more metal nitride layers and a metal layer containing any of the above-described metals. As the metal nitride, a tungsten nitride, a molybdenum nitride, or a titanium nitride can be used. When the metal nitride layer is provided, adhesiveness of the metal layer formed on the metal nitride layer can be increased; accordingly, separation can be prevented.

An insulating layer 106 serves as an interlayer insulating layer for insulating a MOS transistor and a conductive layer serving as a wiring. The insulating layer 106 can be formed of either a single layer or a laminate of an insulating layer containing oxygen or nitrogen, such as a silicon oxide, a silicon nitride, a silicon oxynitride, or a silicon nitride oxide; a layer containing carbon such as DLC (diamond-like carbon); an organic material such as epoxy, polyimide, polyamide, polyvinyl phenol, benzocyclobutene, or acrylic; or a siloxane material such as a siloxane resin, by CVD, sputtering, or the like.

Conductive layers 108 and 109 each serve as a wiring, a plug, or the like. The conductive layers 108 and 109 are formed in a single layer or a laminate of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the element as its main component by CVD, sputtering, or the like. An alloy material containing aluminum as its main component corresponds to, for example, a material which contains aluminum as its main component and also contains nickel, or a material which contains aluminum as its main component and also contains nickel and one or both of carbon and silicon. The conductive layers 108 and 109 are preferably formed with a layered structure having a stack of a barrier film, an aluminum silicon (Al—Si) film, and a barrier film or a layered structure having a barrier film, an aluminum silicon (Al—Si) film, a titanium nitride (TiN) film, and a barrier film. Note that a "barrier film" corresponds to a thin film formed of titanium, a nitride of titanium, molybdenum, or a nitride of molybdenum. Aluminum and aluminum silicon are suitable materials for forming the conductive layers 108 and 109 because they have low resistance and are inexpensive. When barrier films are provided as the top layer and the bottom layer, generation of hillocks of aluminum or aluminum silicon can be prevented. In addition, when a barrier film is formed of titanium which is an element having a high reducing property, even when a thin natural oxide film is formed over a semiconductor substrate, the natural oxide film can be reduced, and a favorable contact between the conductive layer and the semiconductor substrate can be obtained.

An insulating layer serving as a protective film may be formed over the conductive layer 109 and the insulating layer 106. The insulating layer is formed from silicon nitride, silicon oxynitride, silicon nitride oxide, carbon nitride, DLC, or the like. If ion-assisted deposition is performed to form the protective film, a dense protective film can be obtained. When the insulating layer serving as a protective film is provided, intrusion of moisture from outside into a MOS transistor can be suppressed, in particular, the provision of a dense protective film makes the advantageous effect. Accordingly, the reliability of electric characteristics of the MOS transistor and a semiconductor device can be enhanced.

Further, over the insulating layer 106, one pair or plural pairs of a conductive layer and an insulating layer which insulates the conductive layer may be formed in a multilayer structure. With a multilayer structure, high integration is possible.

The antenna 112 is formed in such a manner that a droplet or paste which includes any one or more of metal particles of silver (Ag), gold (Au), copper (Cu), nickel (Ni), platinum (Pt), palladium (Pd), tantalum (Ta), molybdenum (Mo), titanium (Ti), and the like is discharged by a droplet discharge method (an ink-jet method, a dispensing method, or the like), and it is dried and baked. When the antenna is formed by a droplet discharge method, the number of process steps can be reduced, and cost can be reduced accordingly.

Further, the antenna 112 may be formed by a screen printing method. In the case of using a screen printing method, as a material for the antenna 112, a conductive paste in which conductive particles having a particle size of several nanometers to several tens of micrometers are dissolved or dispersed in an organic resin is selectively printed. As the conductive particles, metal particles of one or more of silver (Ag), gold (Au), copper (Cu), nickel (Ni), platinum (Pt), palladium (Pd), tantalum (Ta), molybdenum (Mo), titanium (Ti), and the like, fine particles of silver halide, or dispersing nanoparticles can be used. In addition, as the organic resin included in the conductive paste, one or more selected from organic resins functioning as a binder, a solvent, a dispersive agent, and a coating member of the metal particles can be used. Typically, an organic resin such as an epoxy resin or a silicone resin can be given. Further, in forming the conductive layer, baking is preferably performed after the conductive paste is pushed out.

Alternatively, the antenna 112 may be formed using gravure printing or the like instead of a screen printing method or may be formed from a conductive material by a plating method, sputtering, or the like.

Here, the antenna 112 is formed in such a manner that an aluminum layer is formed by sputtering, and then, the aluminum layer is selectively etched using a resist mask formed by a photolithography process.

As a signal transmission method in an RFID, an electromagnetic coupling method or an electromagnetic induction method (for example, 13.56 MHz band) is applied. In the case of utilizing electromagnetic induction caused by a change in magnetic flux density, the top view of the antenna can be a ring shape (for example, a loop antenna) or a spiral shape (for example, a spiral antenna).

Alternatively, a microwave method (for example, a UHF band (860 MHz to 960 MHz band), a 2.45 GHz band, or the like) can be employed as the signal transmission method in an RFID. In that case, the length, shape, or the like of the antenna may be appropriately set in consideration of a wavelength of an electromagnetic wave used for signal transmission.

FIGS. 9A to 9D each show an example of the antenna 112 of an RFID to which a microwave method can be adapted. For example, the top view of the antenna can be a linear shape (for example, a dipole antenna (see FIG. 9A)), a flat shape (for example, a patch antenna (see FIG. 9B)), a ribbon shape (see FIGS. 9C and 9D), or the like. Further, the shape of the conductive layer serving as an antenna is not limited to a linear shape, and may be a curved shape, a meandering shape, or a shape combining these, in consideration of the wavelength of an electromagnetic wave.

The element substrate 1102 is preferably thinned by partially removing a rear surface portion thereof. As a method for partially removing the rear surface, physical polishing and chemical removal can be given. Physical polishing is performed in such a manner that a protective tape is stuck on a front surface of a semiconductor substrate (a side where a semiconductor element is formed), and then, a rear surface of the semiconductor substrate is mechanically ground, and the rear surface is polished by chemical mechanical polishing. As chemical removal, dry etching using a gas such as $SF_6$ or $CF_4$; wet etching using a liquid mixture of hydrofluoric acid, nitric acid, and acetic acid, or an aqueous solution of potassium hydroxide; or the like can be given. Typically, the thickness of the element substrate 1102 is preferably greater than or equal to 1 μm and less than or equal to 80 μm, more preferably greater than or equal to 1 μm and less than or equal to 50 μm, still more preferably greater than or equal to 1 μm and less than or equal to 20 μm, still more preferably greater than or equal to 1 μm and less than or equal to 10 μm, still more preferably greater than or equal to 1 μm and less than or equal to 5 μm. Alternatively, the element substrate 1102 may be made thinner by separating part of the semiconductor substrate.

The fibrous body 113 provided over one surface or opposing surfaces of the element substrate 1102 is a woven fabric or a nonwoven fabric which uses high-strength fiber of an organic compound or an inorganic compound, and the fibrous body 113 covers an entire surface of the element substrate 1102. High-strength fiber is specifically fiber with a high elongation modulus or fiber with a high Young's modulus. As typical examples of high-strength fiber, polyvinyl alcohol fiber, polyester fiber, polyamide fiber, polyethylene fiber, aramid fiber, polyparaphenylene benzobisoxazole fiber, glass fiber, carbon fiber, and the like can be given. As the glass fiber, glass fiber using E glass, S glass, D glass, Q glass, or the like can be used. It is to be noted that the fibrous body 113 may be formed from one or more kinds of the above-described high-strength fiber.

The fibrous body 113 may be formed using a woven fabric which is woven using bundles of fiber (single yarn) (hereinafter, referred to as yarn bundles) for warp yarns and weft yarns, or a nonwoven fabric obtained by stacking yarn bundles of plural kinds of fiber in a random manner or in one direction. In the case of a woven fabric, a plain-woven fabric, a twilled fabric, a satin-woven fabric, or the like can be appropriately used.

The yarn bundle may have a circular shape or an elliptical shape in cross section. As the yarn bundle, a yarn bundle may be used which has been subjected to fiber opening with a high-pressure water stream, high-frequency vibration using liquid as a medium, continuous ultrasonic vibration, pressing with a roll, or the like. A yarn bundle which is subjected to fabric opening has a large width, can reduce the number of single yarns in the thickness direction, and has an elliptical shape or a flat shape in its cross section. Further, by using a loosely twisted yarn as the yarn bundle, the yarn bundle is easily flattened and has an elliptical shape or a flat shape in cross section. Use of a yarn bundle having an elliptical shape or a flat shape in cross section in this manner can make a thickness of the fibrous body 113 small. Accordingly, a thin semiconductor device can be manufactured. An effect of the present invention is observed when the width of the yarn bundle is greater than or equal to 4 μm and less than or equal to 400 μm, more preferably greater than or equal to 4 μm and less than or equal to 200 μm. In principle, the width of the yarn bundle may be even narrower than that. An effect of the present invention is observed when the thickness of the yarn bundle is greater than or equal to 4 μm and less than or equal to 20 μm. In principle, the thickness of the yarn bundle may be even smaller than that. The width and the thickness depend on a material of fiber.

In the drawings of this specification, the fibrous body 113 is shown as a woven fabric which is plain-woven using a yarn bundle having an elliptical shape in cross section. Although the size of the MOS transistors 1060a and 1060b is larger than that of a yarn bundle of the fibrous body 113, the MOS transistors 1060a and 1060b may be smaller than a yarn bundle of the fibrous body 113.

Figure 8A:
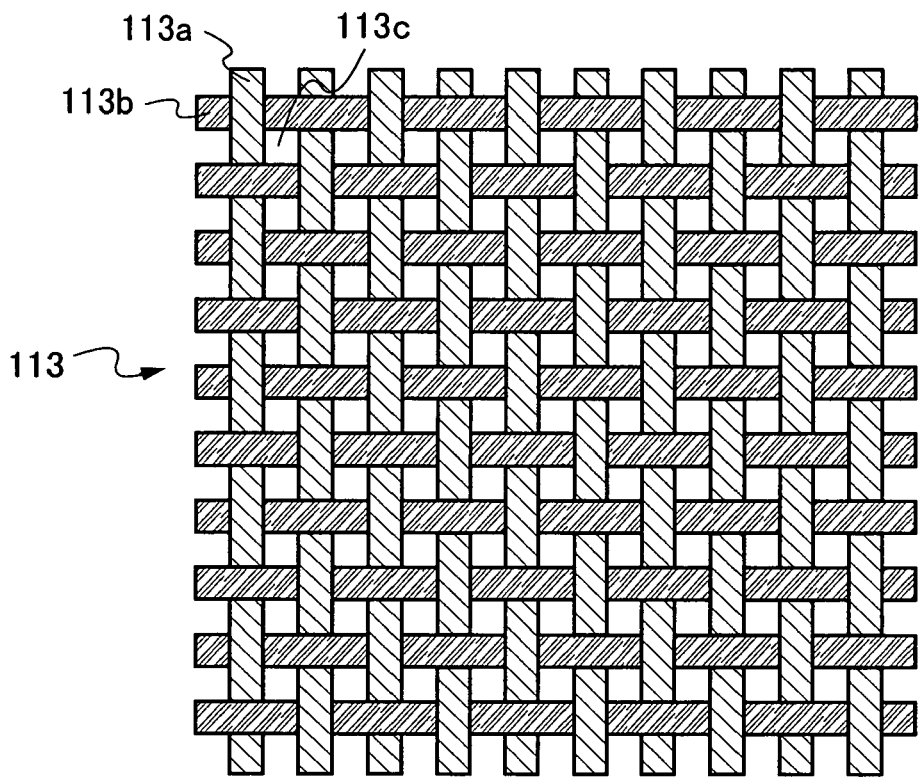
FIGS. 8A and 8B are top views each illustrating a fibrous body which can be applied to the present invention.
Figure 8B:
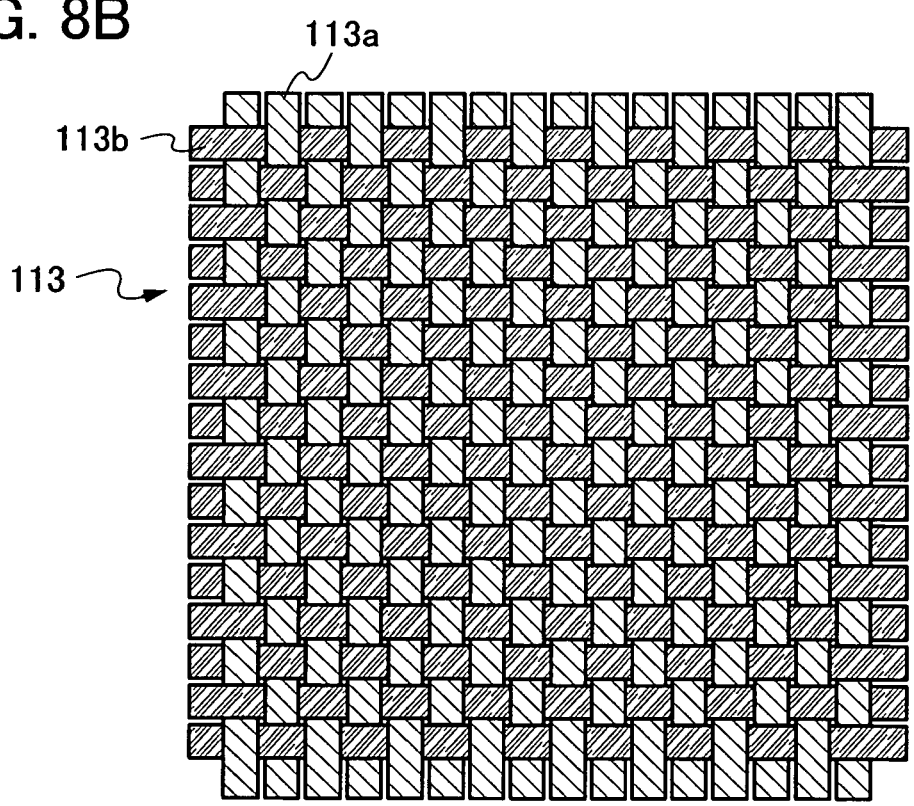
Figure 9A:
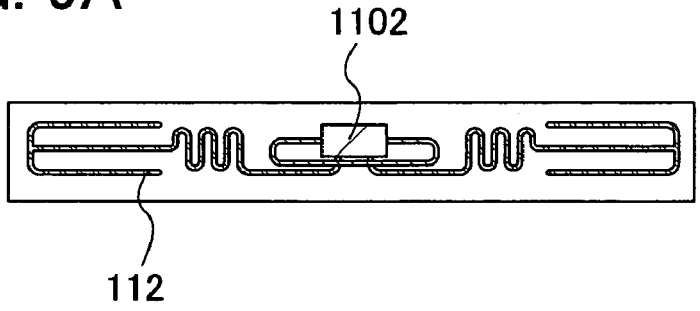
FIGS. 9A to 9D are top views each illustrating an antenna which can be applied to the present invention.
Figure 9B:
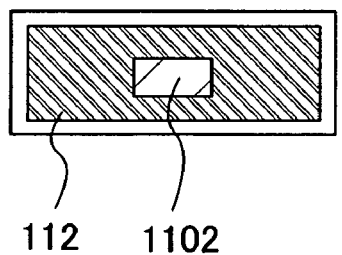
Figure 9C:
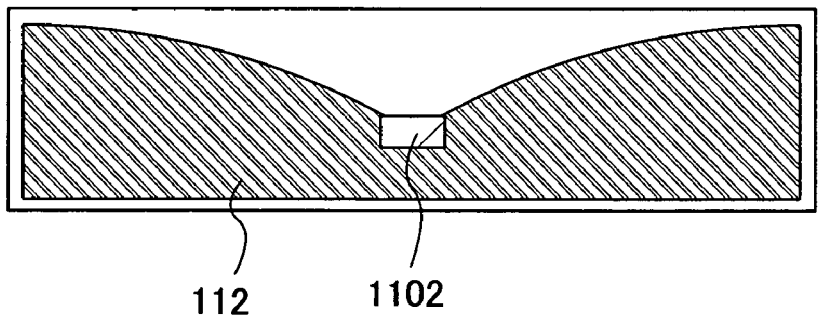
Figure 9D:
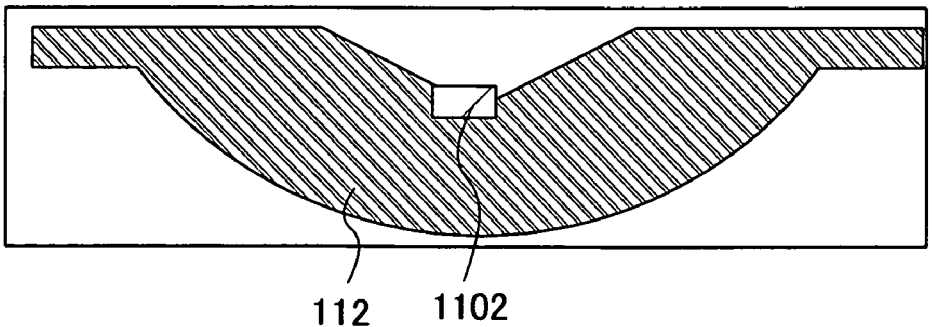

FIGS. 8A and 8B each show a top view of a woven fabric as the fibrous body 113 which is woven using yarn bundles for warp yarns and weft yarns.

As shown in FIG. 8A, the fibrous body 113 is woven using warp yarns 113a spaced at regular intervals and weft yarns 113b spaced at regular intervals. Such a fibrous body has a region without the warp yarns 113a and the weft yarns 113b (referred to as basket holes 113c). In such a fibrous body 113, the fibrous body is further impregnated with an organic resin, whereby adhesiveness between the fibrous body 113 and the element substrate can be further increased.

As shown in FIG. 8B, in the fibrous body 113, density of the warp yarns 113a and the weft yarns 113b may be high and a proportion of the basket holes 113c may be low. Typically, the size of the basket hole 113c is preferably smaller than the area of a locally pressed portion. More typically, the basket hole 113c preferably has a rectangular shape having a side with a length greater than or equal to 0.01 mm and less than or equal to 0.2 mm. When the basket hole 113c of the fibrous body 113 has such a small area, even when pressure is applied by a member with a sharp tip (typically, a writing material such as a pen or a pencil), the pressure can be absorbed in the entire fibrous body 113.

Further, in order to enhance permeability of an organic resin into the inside of the yarn bundle, the fiber may be subjected to surface treatment. For example, as the surface treatment, corona discharge, plasma discharge, or the like for activating a surface of the fiber can be given. Further, surface treatment using a silane coupling agent or a titanate coupling agent can be given.

Figure 1B:
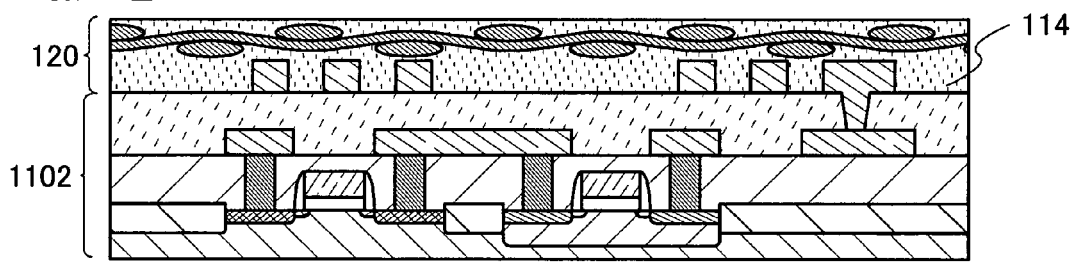

Next, as shown in FIG. 1B, a composition containing an organic resin is applied over the fibrous body 113 and the element substrate 1102 to form an organic resin layer 114. The organic resin layer 114 may be formed of a thermosetting resin such as an epoxy resin, an unsaturated polyester resin, a polyimide resin, a bismaleimide-triazine resin, or a cyanate resin. Further, a thermoplastic resin such as a polyphenylene oxide resin, a polyetherimide resin, or a fluorine resin can be used. Furthermore, a plurality of the above-described thermosetting resin and thermoplastic resin may be used. When the above-described organic resin is used, the fibrous body can be firmly fixed to the element substrate by thermal treatment. The higher the glass transition temperature of the organic resin layer 114 is, the harder the organic resin layer 114 is damaged by local pressure, which is preferable.

As a method of forming the organic resin layer 114, a printing method, a cast method, a droplet discharge method, a dip coating method, or the like can be used.

Here, the organic resin layer 114 is wholly or partially impregnated with the fibrous body 113. In other words, the fibrous body 113 is included in the organic resin layer 114. Thus, the adhesion between the fibrous body 113 and the organic resin layer 114 is increased.

Highly thermally-conductive filler may be dispersed in the organic resin layer 114 or the yarn bundle of the fibrous body. As the highly thermally-conductive filler, an aluminum nitride, a bromine nitride, a silicon nitride, alumina, or the like can be given. As the highly thermally-conductive filler, a metal particle such as silver or copper can also be given. When the highly thermally-conductive filler is included in the organic resin or the yarn bundle, heat generated in the element substrate can be easily released to the outside. Accordingly, thermal storage of the semiconductor device can be suppressed, and malfunction of the semiconductor device can be reduced.

The organic resin 114 is heated so that the organic resin 114 is plasticized or cured. In the case where the organic resin is an organic plastic resin, the organic resin which is plasticized is then cured by cooling to room temperature.

Figure 1C:
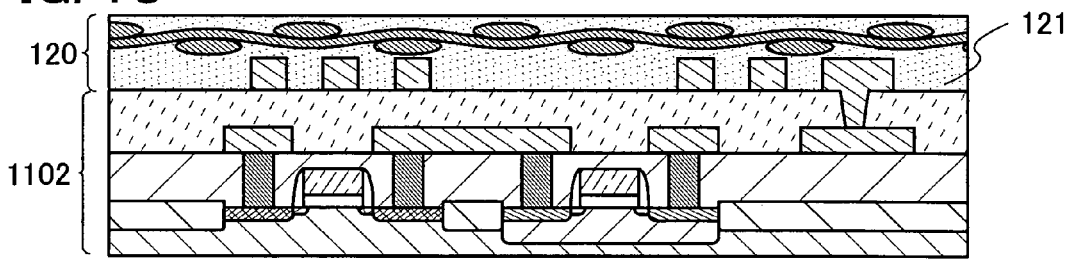

Consequently, as shown in FIG. 1C, the organic resin 114 becomes an organic resin layer 121 with which the fibrous body 113 is impregnated and which is firmly fixed to one side of the element substrate 1102 and one side of the antenna 112. It is to be noted that the organic resin layer 121 and the fibrous body 113 which are firmly fixed to one side of the element substrate 1102 and one side of the antenna 112 are collectively referred to as a sealing layer 120.

In the case where a plurality of semiconductor devices are included in the element substrate 1102, the plurality of semiconductor devices may be obtained by dividing the element substrate 1102 and the sealing layers. Through such steps, a plurality of semiconductor devices can be manufactured.

As described above a semiconductor device can be manufactured.

Figure 1D:
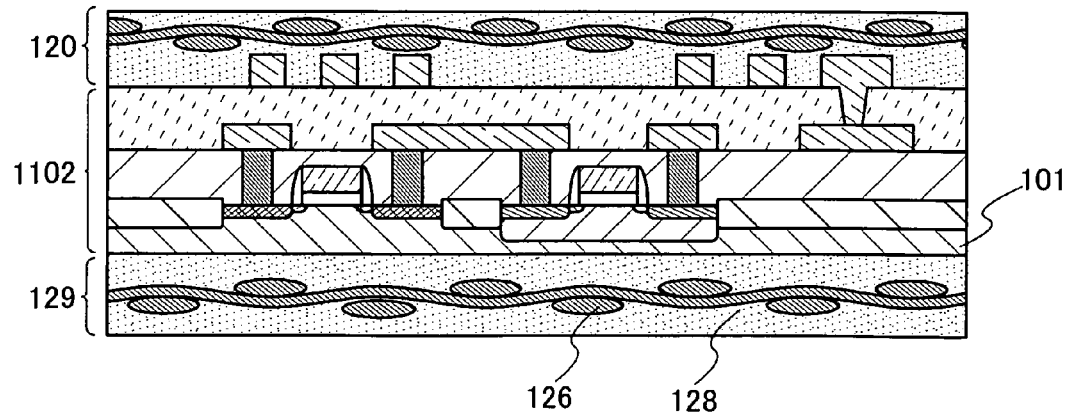

Note that a sealing layer may also be formed on the semiconductor substrate 101 side. A fibrous body 126 is provided over the semiconductor substrate 101. The fibrous body 126 may use the fibrous body 113 shown in FIG. 1A as appropriate. A composition containing an organic resin is applied to the fibrous body 126 and the element substrate 1102 to coat them and then the fibrous body 126 and the element substrate 1102 are baked to form an organic resin layer. The organic resin layer may use the organic resin layer 114 shown in FIG. 1B as appropriate. Next, the organic resin layer is heated to plasticize or cure the organic resin of the organic resin layer. In the case where the organic resin is plastic, the plasticized organic resin is then cured by cooling to room temperature. Consequently, as shown in FIG. 1D, a sealing layer 129 including an organic resin layer 128 with which a fibrous body 126 is impregnated and which is formed on the semiconductor substrate 101 can be formed. That is, a semiconductor device provided with the sealing layers 120 and 129 on opposing surfaces of the element substrate 1102 can be manufactured.

The sealing layers 120 and 129 at this time are preferably formed from the same fibrous body and organic resin in order to reduce warpage. However, in the case where the front and the back are distinguished from each other, it is not necessary that the sealing layers 120 and 129 are formed from the same materials. In such a manner, the organic resin with which the fibrous body is impregnated is firmly fixed to the opposing surfaces of the element substrate, whereby the element substrate can be supported by the fibrous body. Therefore, warpage of the semiconductor device can be reduced, which makes it easy to mount the semiconductor device on a laminate film, a seal, or the like.

The direction of the warp yarn or the weft yarn of the fibrous body of the sealing layer 120 formed over the element substrate 1102 and the direction of the warp yarn or the weft yarn of the fibrous body of the sealing layer 129 may be deviated from each other by 30° or more and 60° or less, more preferably 40° or more and 50° or less. In this case, since stretching directions of the fibrous bodies provided on the front and the back of the element substrate are different from each other, stretching due to local pressure is isotropic. Thus, destruction caused by local pressure can be further reduced.

Note that in FIG. 1A to 1D, the organic resin layer 114 is formed after the fibrous body 113 is provided over the element substrate 1102; alternatively, the fibrous body may be provided over the element substrate 1102 and the organic resin layer 114 after the organic resin layer 114 is formed over the element substrate 1102. Those steps will be described below.

Figure 2A:
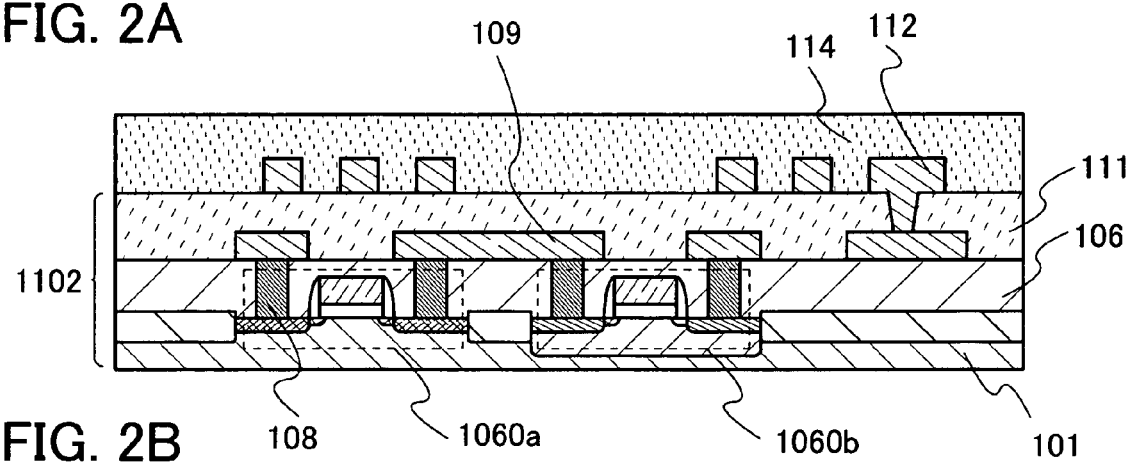
FIGS. 2A to 2C are cross-sectional views illustrating a manufacturing method of a semiconductor device of the present invention.

As shown in FIG. 2A, the element substrate 1102 using a single-crystal semiconductor substrate or an SOI substrate is formed over the semiconductor substrate 101, and an antenna 112 is formed over the element substrate 1102. Next, the organic resin layer 114 is formed over the element substrate 1102 and the antenna 112.

Figure 2B:
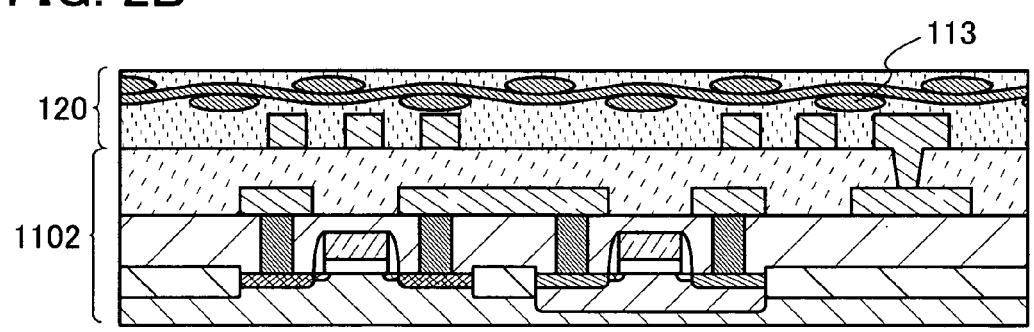

Next, as shown in FIG. 2B, the fibrous body 113 is provided over the element substrate 1102 and the antenna 112. Here, the fibrous body 113 is pressed against the organic resin layer 114, the fibrous body 113 can be contained in the organic resin layer 114. Further, the fibrous body 113 is impregnated with the organic resin.

The organic resin 114 is heated so that the organic resin 114 is plasticized or cured. In the case where the organic resin is an organic plastic resin, the organic resin which is plasticized is then cured by cooling to room temperature.

Figure 2C:
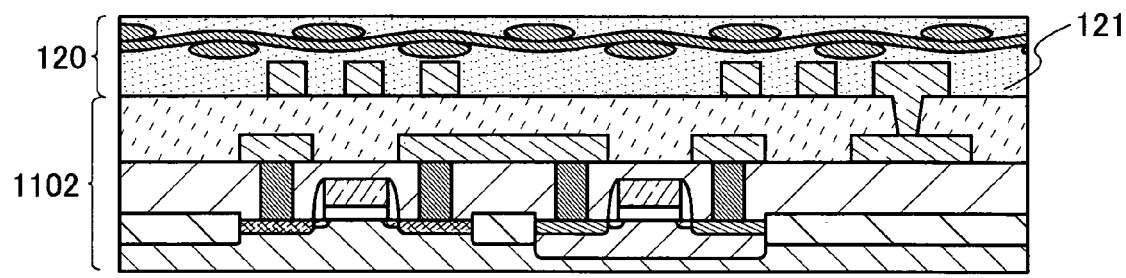

Consequently, as shown in FIG. 2C, the organic resin 114 becomes an organic resin layer 121 with which the fibrous body 113 is impregnated and which is firmly fixed to one side of the element substrate 1102 and one side of the antenna 112. It is to be noted that the organic resin layer 121 and the fibrous body 113 which are firmly fixed to one side of the element substrate 1102 and one side of the antenna 112 are collectively referred to as a sealing layer 120.

After that, as in FIG. 1D, the sealing layer 129 may be formed on the semiconductor substrate 101.

As described above a semiconductor device can be manufactured.

Here, effects of the semiconductor device described in this embodiment mode will be described with reference to FIGS. 3A to 3D.

Figure 3A:
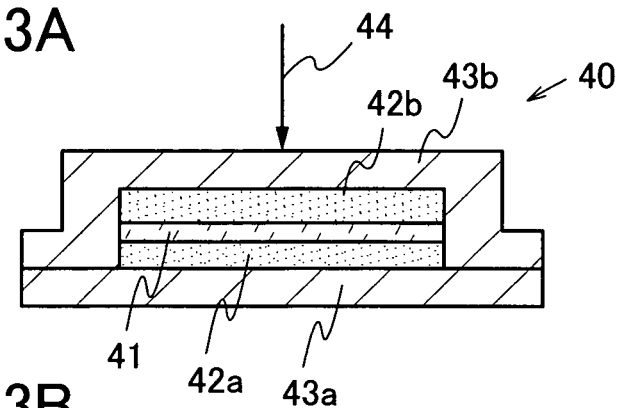
FIGS. 3A to 3D are cross-sectional views illustrating a manufacturing method of a semiconductor device of the present invention.

As shown in FIG. 3A, in a conventional semiconductor device 40, an element substrate 41 including a semiconductor element formed using a single-crystal semiconductor substrate or an SOI substrate is sealed with films 43a and 43b using adhesive members 42a and 42b. Local pressure 44 is applied to a semiconductor device having such a structure.

Figure 3B:
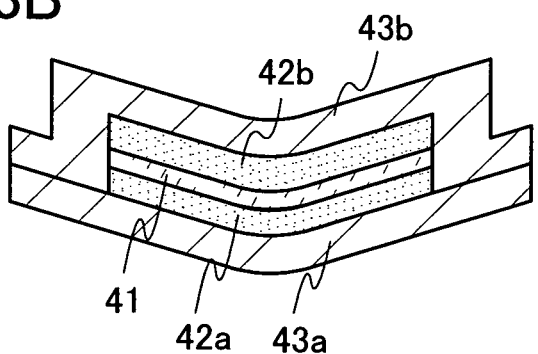

As a result, as shown in FIG. 3B, a layer which forms the element substrate 41, the adhesive members 42a and 42b, and the films 43a and 43b are each stretched, and a curve with a small radius of curvature is generated in the pressed portion. Accordingly, the semiconductor element included in the element substrate 41, a wiring, or the like are cracked, and the semiconductor device is destroyed.

Figure 3C:
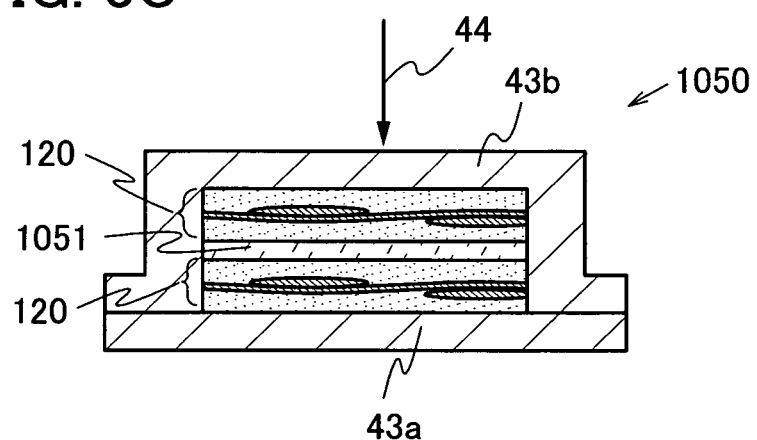
Figure 3D:
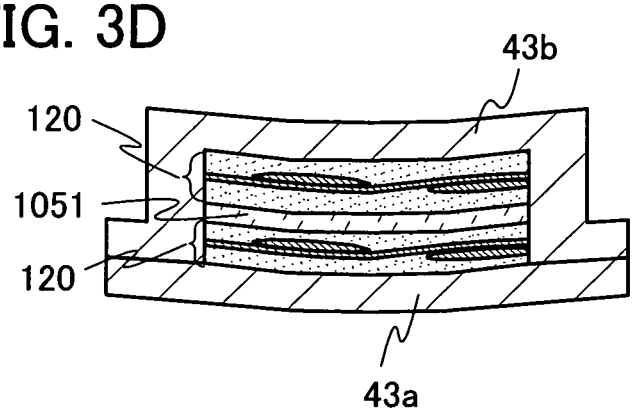

However, in a semiconductor device 1050 described in this embodiment mode, as shown in FIG. 3C, a sealing layer formed of a fibrous body including an organic resin is provided on one side or opposite sides of an element substrate 1051. The fibrous body is formed from high-strength fiber, which has a high elongation modulus or a high Young's modulus. Accordingly, even when the local pressure 44 such as point pressure or linear pressure is applied, the high-strength fiber is not stretched. Pressing force is dispersed throughout the fibrous body, and the whole semiconductor device is curved. Thus, even when local pressure is applied, a curve generated in the semiconductor device has a large radius of curvature as shown in FIG. 3D, and the semiconductor element included in the element substrate 1051, a wiring, and the like are not cracked, and accordingly, destruction of the semiconductor device can be reduced.

Further, when the element substrate 1051 is formed to have a small thickness, the semiconductor device can be curved. Accordingly, the area of the element substrate 1051 can be enlarged, and thus, steps of manufacturing the semiconductor device can be easily performed. In the case where the semiconductor device is an RFID with a built-in antenna, the size of the antenna can be increased. Thus, an RFID with a long communication distance can be manufactured.

In the case where a plurality of semiconductor devices are included in the element substrate 1102, the plurality of semiconductor devices may be obtained by dividing the element substrate 1102 and the sealing layers. With such a step, a plurality of semiconductor devices can be manufactured. When the division is performed, selective division is possible by dicing, scribing, using a cutting machine having an edged tool such as scissors or a knife, laser cutting, or the like.

Further, paper including a semiconductor device can be formed by embedding the semiconductor device. Specifically, the semiconductor device is provided on a first wet paper. A second wet paper is disposed on thereon and pressing and drying are performed. As a result, paper including a semiconductor device can be formed. After that, the paper may be cut into the appropriate size.

In a semiconductor device described in this embodiment mode, an element substrate having a semiconductor element formed using a single-crystal semiconductor substrate or an SOI substrate and a fibrous body are firmly fixed together with an organic resin. Since local pressure applied to the fibrous body is dispersed throughout the fibrous body, local pressure is hardly applied. Accordingly, a wiring or a semiconductor element included in the semiconductor device is not stretched and the semiconductor device is not easily destroyed. That is, stretching of the semiconductor element, the wiring, or the like formed in the element substrate can be reduced, and thus, a yield can be improved.

Further, when the element substrate is formed to have a small thickness, the semiconductor device can be curved. Accordingly, the area of the element substrate can be enlarged, and thus, steps of manufacturing the semiconductor device can be easily performed. In the case where the semiconductor device is an RFID with a built-in antenna, the size of the antenna can be increased. Thus, an RFID with a long communication distance can be manufactured.

Embodiment Mode 2

Figure 4A:
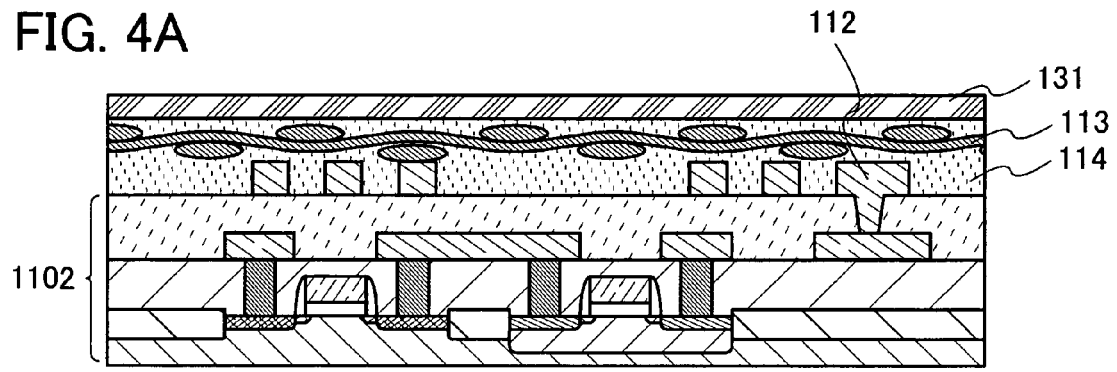
FIGS. 4A to 4C are cross-sectional views illustrating a manufacturing method of a semiconductor device of the present invention.
Figure 4B:
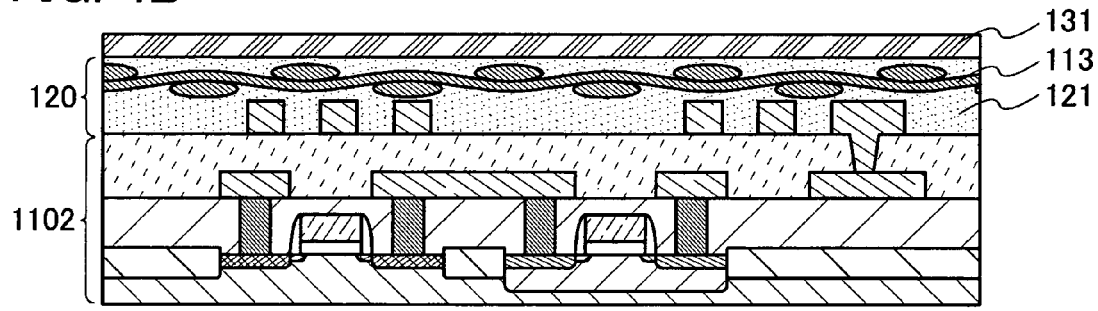
Figure 4C:
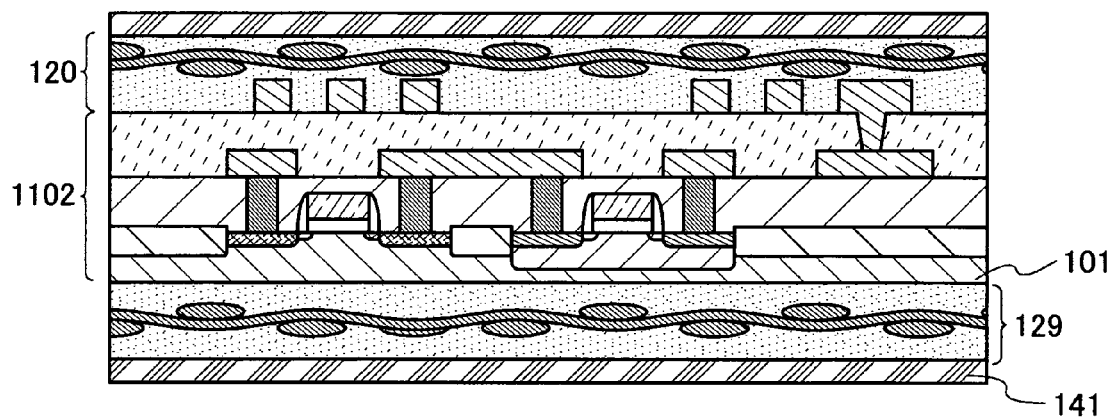

In this embodiment mode, a manufacturing method of a semiconductor device which is not easily destroyed as compared with the one in Embodiment Mode 1, with reference to FIGS. 4A to 4C.

In a similar manner to Embodiment Mode 1, as shown in FIG. 4A, an antenna 112 and an element substrate 1102 including a semiconductor element formed using a single-crystal semiconductor substrate or an SOI substrate are formed. Then, a fibrous body 113 is provided over the element substrate 1102 and the antenna 112, an organic resin layer 114 is formed, and a protective film 131 is provided over the organic resin layer 114.

The protective film 131 is preferably formed from a high-strength material. As typical examples of a high-strength material, a polyvinyl alcohol resin, a polyester resin, a polyamide resin, a polyethylene resin, an aramid resin, a polyparaphenylene benzobisoxazole resin, a glass resin, and the like can be given.

Since the protective film 131 is formed from a high-strength material, destruction by local pressure can be suppressed compared with Embodiment Mode 1. In specific, in a fibrous body 113, in the case where the area of a basket hole in which a warp yarn bundle and a weft yarn bundle are not distributed is larger than the area to which local pressure is applied, when the basket hole is locally loaded, the pressure is not absorbed in the fibrous body 113 but is directly applied to the element substrate 1102 and the antenna 112. As a result, the element substrate 1102 and the antenna 112 are stretched, and the semiconductor element or the wiring is destroyed.

However, by providing over the organic resin layer 114 the protective film 131 formed from a high-strength material, a local load is absorbed in the entire protective film 131, leading to a semiconductor device which is not easily destroyed by local pressure.

Next, as shown in FIG. 4B, in a similar manner to Embodiment Mode 1, the organic resin layer 114 is heated, so that a sealing layer 120 is formed. The protective film 131 is firmly fixed to the element substrate 1102 and the antenna 112 by an organic resin of the sealing layer 120. That is, the fibrous body 113 and the protective film 131 are firmly fixed to the element substrate 1102 and the antenna 112 by the sealing layer 120. The fibrous body 113 is impregnated with the organic resin layer 121 included in the sealing layer 120.

Next, as shown in FIG. 4C, the following steps may be performed: the semiconductor substrate 101 of the element substrate 1102 is provided with a fibrous body, an organic resin layer is formed, a protective film 141 is provided, and heating and pressure bonding is performed to firmly fix the protective film 141 to the element substrate 1102 using the sealing layer 129.

In FIG. 4A, in the case where the protective film 131 is a thermoplastic material, the protective film 131 may alternatively be provided between the element substrate 1102 and the antenna 112, and the fibrous body 113, and thermocompression bonding may be performed. Alternatively, protection film 131 may be provided between the fibrous body 113 and the organic resin layer 114, the element substrate 1102, and the antenna 112, and thermocompression bonding may be performed. In FIG. 4C, in the case where the protective film 141 is a thermoplastic material, the protective film 141 may be provided between the element substrate 1102 and the fibrous body, and thermocompression bonding may be performed. Further, the protective film 141 may be provided between the element substrate 1102 and the fibrous body, and the organic resin layer, and thermocompression bonding may be performed. This structure also makes it possible to disperse the load applied by local pressure using the protection film and the fibrous body, thus, destruction can be suppressed.

In the case where a plurality of semiconductor devices are included in the element substrate 1102, the plurality of semiconductor devices may be obtained by dividing the element substrate 1102 and the sealing layers. Through such steps, a plurality of semiconductor devices can be manufactured.

Further, as in Embodiment Mode 1, paper including a semiconductor device can be formed by embedding the semiconductor device.

In a manner described above, a semiconductor device which is not easily destroyed by local pressure can be manufactured. Further, when the element substrate is formed to have a small thickness, the semiconductor device can be curved. Accordingly, the area of the element substrate can be enlarged, and thus, steps of manufacturing the semiconductor device can be easily performed. In the case where the semiconductor device is an RFID with a built-in antenna, the size of the antenna can be increased. Thus, an RFID with a long communication distance can be manufactured.

Embodiment Mode 3

In this embodiment mode, a method for manufacturing a semiconductor device in which an antenna is not formed in an element substrate and an antenna provided over another substrate is connected to the element substrate will be described with reference to FIG. 5A to FIG. 7C.

Figure 5A:
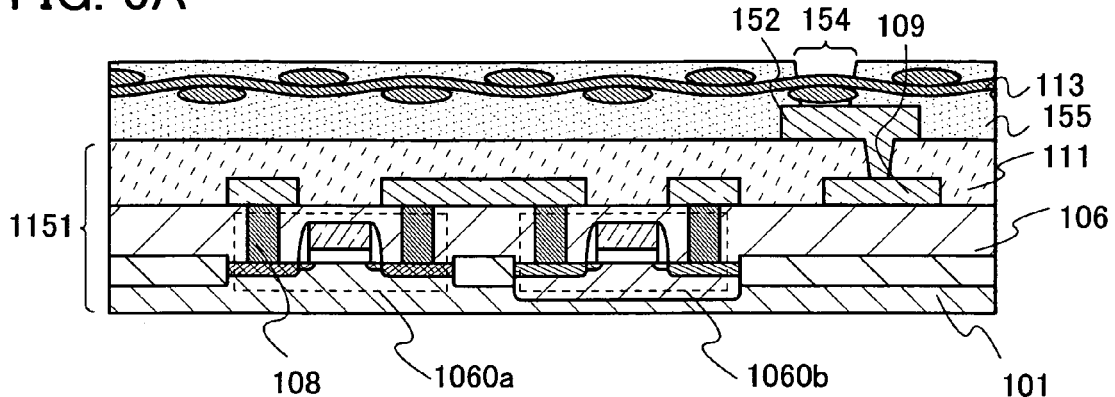
FIGS. 5A to 5C are cross-sectional views illustrating a manufacturing method of a semiconductor device of the present invention.

As shown in FIG. 5A, a fibrous body 113 and an organic resin layer 155 having an opening 154 are formed over an element substrate 1151.

Here, as the element substrate 1151, as described in Embodiment Mode 1, the semiconductor substrate 101 is provided with the MOS transistors 1060a and 1060b. An insulating layer 106 is formed over the MOS transistors 1060a and 1060b, and conductive layers 108 and 109 which connect to a source region and a drain region of the MOS transistors are formed through the insulating layer 106. An insulating layer 111 is formed over the conductive layers 108 and 109 and the insulating layer 106, and an electrode pad 152 is formed so as to connect to the conductive layer 109 through the insulating layer 111.

The organic resin layer 155 is formed so as to have an opening 154 in which part of the electrode pad 152 is exposed, by providing a composition in which an organic resin is diluted with an organic solvent over the element substrate 1151 by a printing method or a droplet discharge method and performing drying by baking.

Figure 5B:
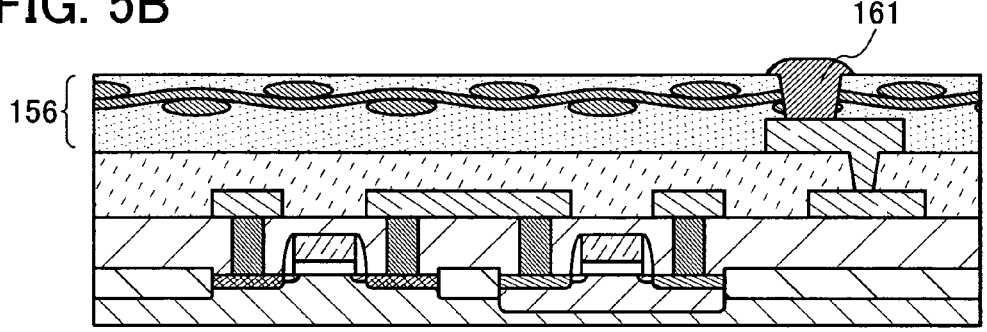

As shown in FIG. 5B, a connection terminal 161 is formed in an opening in the organic resin layer 155. The connection terminal 161 can be formed by a printing method, a droplet discharge method, or the like. As a material for the connection terminal 161, at least one of metal particles of silver (Ag), gold (Ag), copper (Cu), nickel (Ni), platinum (Pt), palladium (Pd), tantalum (Ta), molybdenum (Mo), and titanium (Ti); fine particles of silver halide; or dispersive nanoparticles can be used. Next, the material of the connection terminal is baked to form a sealing layer 156 including the organic resin layer 155 and the fibrous body 113 on one side surface of the element substrate 1151. Note that the sealing layer 156 is provided with the connection terminal 161 which connects to the electrode pad 152.

Figure 5C:
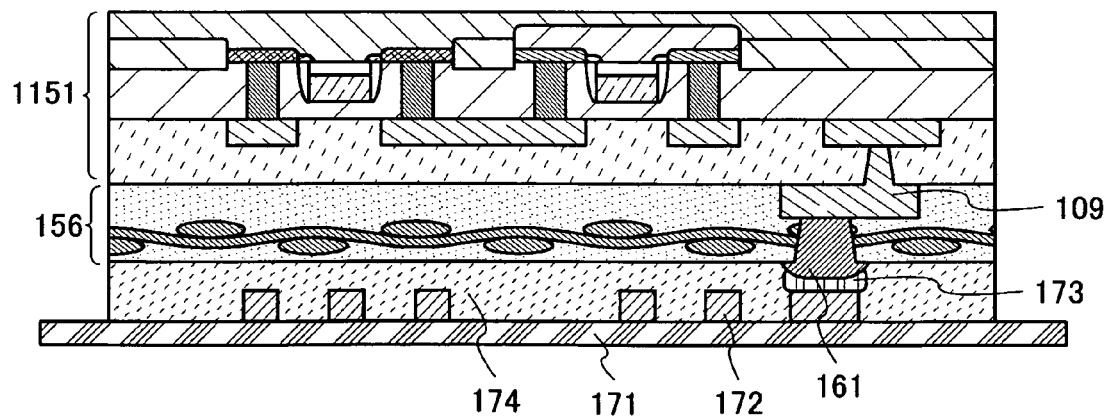

Then, as shown in FIG. 5C, the sealing layer 156 which is firmly fixed to the element substrate 1151 and a substrate 171 provided with an antenna 172 are bonded together by with an adhesive 174. At this time, the connection terminal 161 which is formed on the element substrate 1151 and the antenna 172 are electrically connected to each other by an anisotropic conductive adhesive member 173.

As the anisotropic conductive adhesive member 173, an adhesive resin containing conductive particles (each grain size is several nanometers to several tens of micrometers), which are dispersed, such as an epoxy resin or a phenol resin can be given. The conductive particle is formed from one or more elements selected from gold, silver, copper, palladium, nickel, carbon, and platinum. Further, a particle having a multilayer structure of these elements may be used. Furthermore, a conductive particle in which a thin film which is formed from one or more elements selected from gold, silver, copper, palladium, nickel, and platinum is formed over a surface of a particle formed from a resin may be used. Further alternatively, a CNT (carbon nanotube) may be used as the conductive particle.

The antenna 172 can be appropriately formed using a material and a formation method which are similar to those of the antenna 112 described in Embodiment Mode 1.

As the substrate 171 over which the antenna 172 is formed, a plastic film substrate, for example, a plastic substrate of polyethylene terephthalate (PET), polyether sulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), or the like can be used.

Figure 6A:
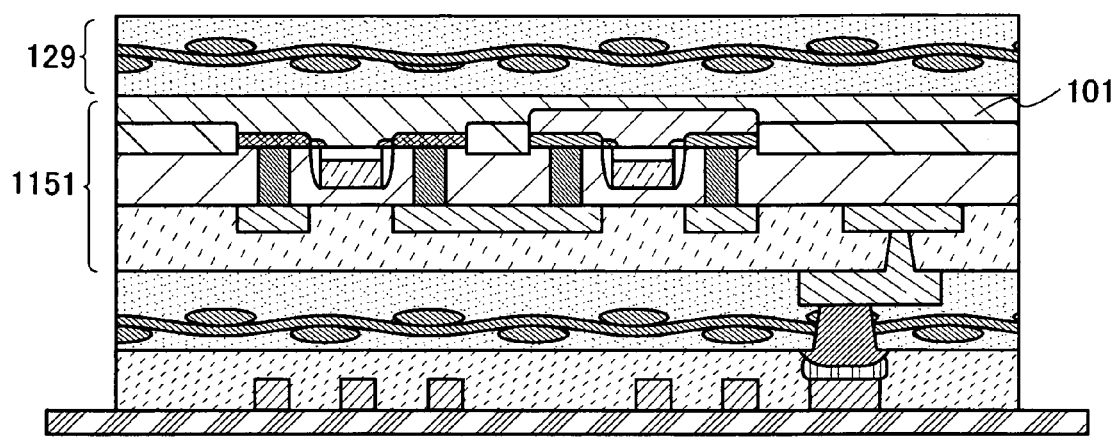
FIGS. 6A and 6B are cross-sectional views illustrating a manufacturing method of a semiconductor device of the present invention.

Then, as shown in FIG. 6A, in a similar manner to Embodiment Mode 1, a sealing layer 129 may be formed over a surface of the semiconductor substrate 101.

Figure 6B:
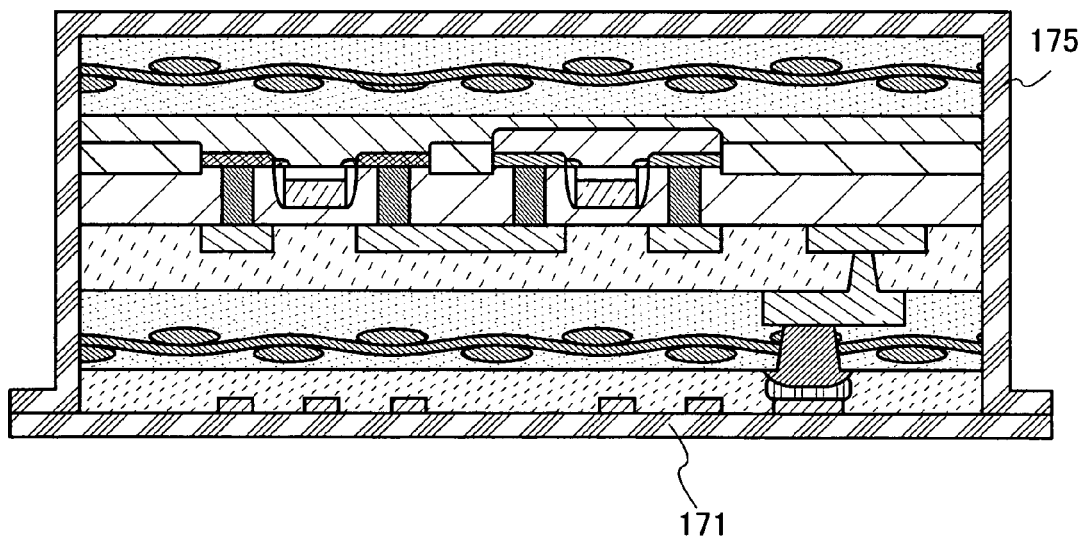

Then, as shown in FIG. 6B, a film 175 may be provided so as to seal the substrate 171 over which the antenna 172 is formed, the sealing layer 156, the element substrate 1151, and the sealing layer 129. The film can be a film similar to that of the substrate 171 over which the antenna 172 is formed.

The above mode describes a semiconductor device in which the substrate 171 having the antenna 172 is bonded to only one surface of the element substrate 1151; however, the substrates over each of which the antenna is formed may be bonded to opposing surfaces of the element substrate 1151. The mode is described with reference to FIGS. 7A to 7C.

In an element substrate 1181, as described in Embodiment Mode 1, the MOS transistors 1060*a* and 1060*b* are formed in a semiconductor substrate 101. An insulating layer 106 is formed over the MOS transistors 1060*a* and 1060*b*, and conductive layers 108 and 109 which are connected to a source region and a drain region of the MOS transistor through the insulating layer 106 are formed. An insulating layer 111 is formed over the conductive layers 108 and 109 and the insulating layer 106, and an electrode pad 152 and a conductive layer 153 which are connected to the conductive layer 109 through the insulating layer 111 are formed.

Then, a through hole is formed in the semiconductor substrate 101, the insulating layer 106, and the insulating layer 111. A through electrode 183 is formed on a surface of the through hole. The through electrode 183 is in contact with the conductive layer 153. The through electrode 183 is insulated from the semiconductor substrate 101 by an insulating layer 184.

After that, a connection terminal 161 is formed by a similar step to FIGS. 5A and 5B on one surface of the element substrate 1181. Then, by a step similar to FIG. 5C, a substrate 171 on which an antenna 172 is formed and a sealing layer 156 provided on one surface of the element substrate 1181 are bonded together with the adhesive 174.

A fibrous body is provided over the semiconductor substrate 101 of the element substrate 1181 and an organic resin layer is formed, and then, heating is performed to form a sealing layer 125. Next, in order to form a connection terminal which is connected to the through electrode 183, an opening is formed in part of the sealing layer 125. Here, the opening penetrating through the sealing layer 125 to the through electrode 183 is formed by laser irradiation to expose part of the through electrode 183.

Figure 7A:
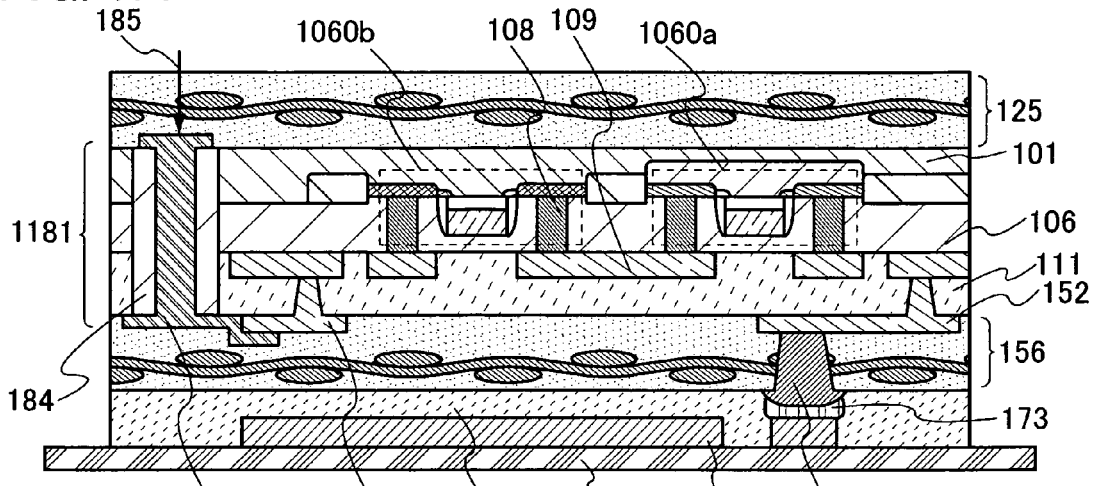
FIGS. 7A to 7C are cross-sectional views illustrating a manufacturing method of a semiconductor device of the present invention.
Figure 7B:
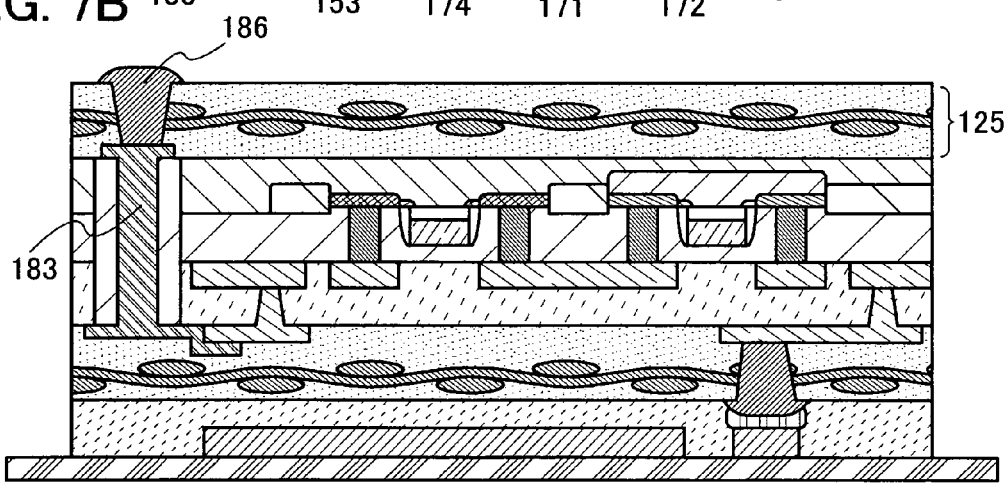

Then, as shown in FIG. 7B, a connection terminal 186 is formed so as to fill the opening. The connection terminal 186 can be formed in a similar manner to the connection terminal 161.

Figure 7C:
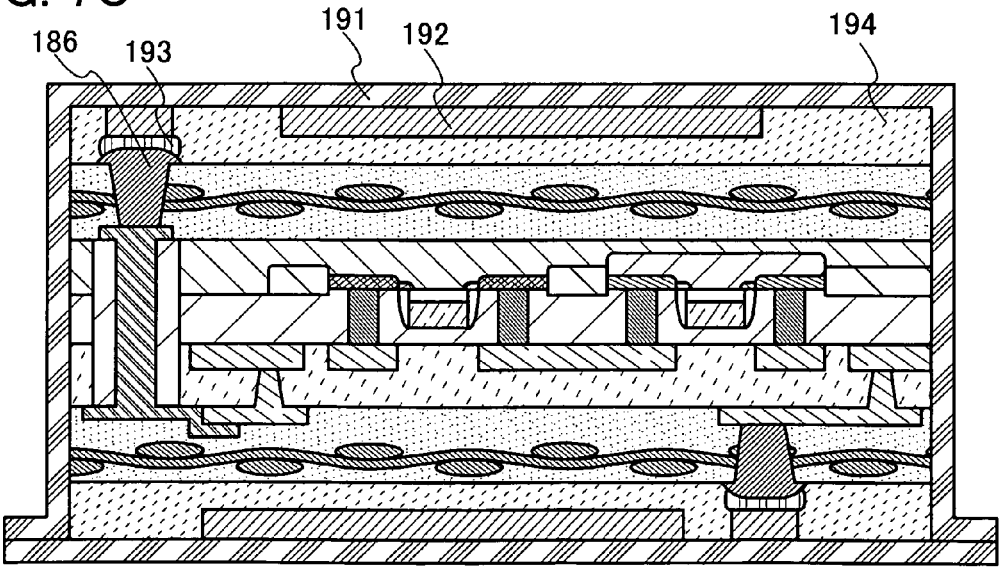

As shown in FIG. 7C, the sealing layer 129 and a substrate 191 provided with an antenna 192 are bonded together, and the connection terminal 186 and the antenna 192 are electrically connected to each other by an anisotropic conductive adhesive member 193.

In a manner described above, a semiconductor device in which opposing surfaces of the element substrate are provided with antennas can be manufactured. Such a semiconductor device is preferably applied to the semiconductor device having a symmetrical antenna such as an RFID capable of receiving an electric wave of a UHF band, because the size of the semiconductor device can be reduced.

In the case where a plurality of semiconductor devices are included in each of the element substrates 1151 and 1181, the plurality of semiconductor devices may be obtained by dividing the element substrates 1151 and 1181 and the sealing layers. Through such steps, a plurality of semiconductor devices can be manufactured.

Further, as in Embodiment Mode 1, paper including a semiconductor device can be formed by embedding the semiconductor device.

In a semiconductor device described in this embodiment mode, an element substrate having a semiconductor element formed using a single-crystal semiconductor substrate or an SOI substrate and a fibrous body are firmly fixed together by an organic resin. In the fibrous body, pressure given by local pressing is dispersed throughout fiber; thus, local pressure is not easily applied. Accordingly, a wiring or a semiconductor element included in the semiconductor device are not stretched and the semiconductor device is not easily destroyed. That is, stretching of the semiconductor element formed in the element substrate, the wiring, or the like can be reduced, and thus, a yield can be improved.

Further, when the element substrate is formed to have a small thickness, the semiconductor device can be curved. Accordingly, the area of the element substrate can be enlarged, and thus, steps of manufacturing the semiconductor device can be easily performed because a connection area for connecting an external antenna to the element substrate can be enlarged. In the case where the semiconductor device is an RFID with a built-in antenna, the size of the antenna can be increased. Thus, an RFID with a long communication distance can be manufactured.

Embodiment Mode 4

Figure 10A:
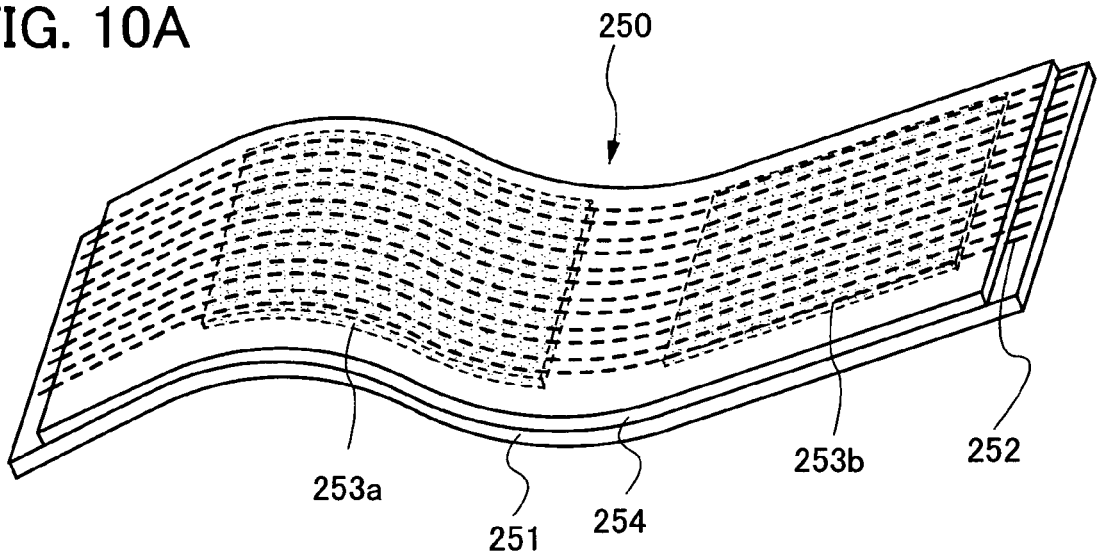
FIGS. 10A and 10B are a perspective view and a cross-sectional view, respectively, each of which illustrates a semiconductor device of the present invention.
Figure 10B:
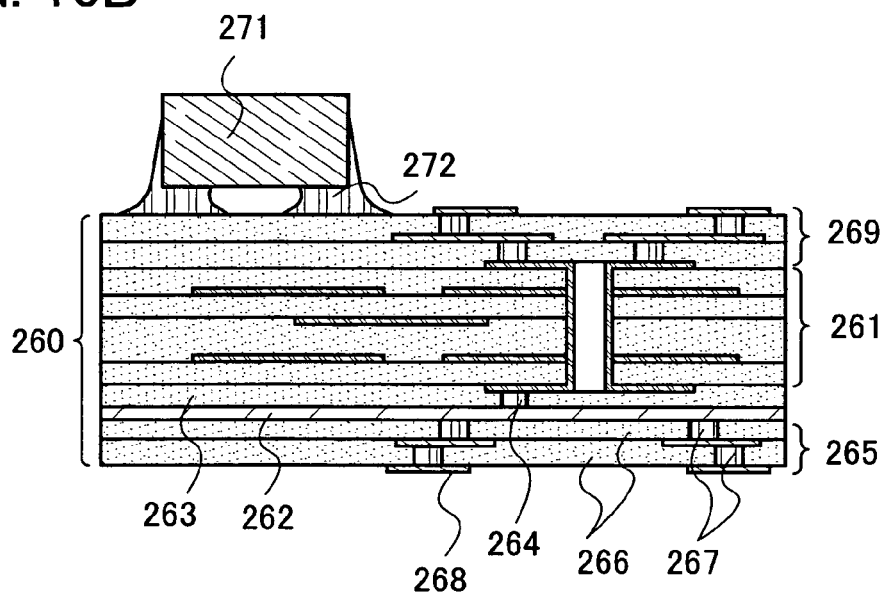

This embodiment mode describes a semiconductor device in which any of the element substrates, which are described in Embodiment Modes 1 to 3, including a semiconductor element formed using a single-crystal semiconductor substrate or an SOI substrate is connected to a printed board, with reference to FIGS. 10A and 10B.

FIG. 10A is a perspective view of a semiconductor device 250 of this embodiment mode. In the semiconductor device 250, an element substrate including a semiconductor element formed using a single-crystal semiconductor substrate or an SOI substrate, which is described in Embodiment Modes 1 to 3, is provided for a flexible printed board. For example, a wiring 252 formed from copper, gold, silver, aluminum, or the like is provided over a base film 251 formed from polyester, polyimide, or the like. Stacks 253*a* and 253*b*, in each of which the element substrate including a semiconductor element formed using a single-crystal semiconductor substrate or an SOI substrate, which is described in Embodiment Modes 1 to 3, and a sealing layer are stacked are provided over the wiring 252 with an insulating layer interposed between the wiring 252 and the stacks 253*a* and 253*b*. The wiring 252 is connected to the stacks 253*a* and 253*b* through a connection terminal formed in a contact hole of the sealing layer. Part of the base film 251, part of the wiring 252, and the stacks 253*a* and 253*b* are covered with a protective film 254. In an edge portion of the semiconductor device 250, part of the protective film 254 is removed, and an external circuit such as a connector and the wiring 252 are exposed.

The element substrate is provided for a base substrate with the sealing layer interposed therebetween, and the element substrate can be firmly fixed to the wiring and a base substrate by heating and pressure bonding.

Here, a semiconductor device having the wiring 252 of one layer is described below. Alternatively, a multilayer wiring structure may be employed. Further, a plurality of wirings may interpose the stacks 253*a* and 253*b*. Such a multilayer wiring can increase packing density.

FIG. 10B is a cross-sectional view of a semiconductor device 260 of this embodiment mode. In the semiconductor device 260, an element substrate including a semiconductor element formed using a single-crystal semiconductor substrate or an SOI substrate, which is described in Embodiment Modes 1 to 3, is provided on a printed board. For example, an element substrate 262 including a semiconductor element formed using a single-crystal semiconductor substrate or an SOI substrate, which is described in Embodiment Modes 1 to 3, is provided on one surface of a core layer 261. A wiring or a semiconductor element included in the element substrate 262 including a semiconductor element formed using a single-crystal semiconductor substrate or an SOI substrate, which is described in Embodiment Modes 1 to 3, is connected to the core layer 261 by a via 264 passing through a sealing layer 263.

A multilayer wiring 265 is provided on the element substrate 262. The core layer 261, and the semiconductor element, the wiring, and the like which are formed in the element substrate 262 are electrically connected to a conductive pattern 268 formed on a surface of the semiconductor device 260, by vias 267 formed in organic resin layers 266 of the multilayer wiring 265.

A multilayer wiring 269 is provided on the opposite surface of the core layer 261.

In addition, a chip 271 such as a capacitor, a coil, a resistor, or a diode may be mounted on the semiconductor device 260 with the use of a mounting member 272 such as a conductive paste or a wire.

In the semiconductor device of this embodiment mode, a printed board has a layer including a semiconductor element formed using a single-crystal semiconductor substrate or an SOI substrate. Further, the element layer is provided in a printed board with the use of a prepreg using a fibrous body. Thus, even when a local load (point pressure, linear pressure, or the like) is applied, pressure is dispersed in the fibrous body, and destruction in a mounting step or generated by a curve can be reduced. Furthermore, high integration is possible.

Embodiment Mode 5

This embodiment mode describes a structure and an application example of a semiconductor device of the present invention. Here, an RFID and a memory device are described as typical examples of a semiconductor device.

Figure 11:
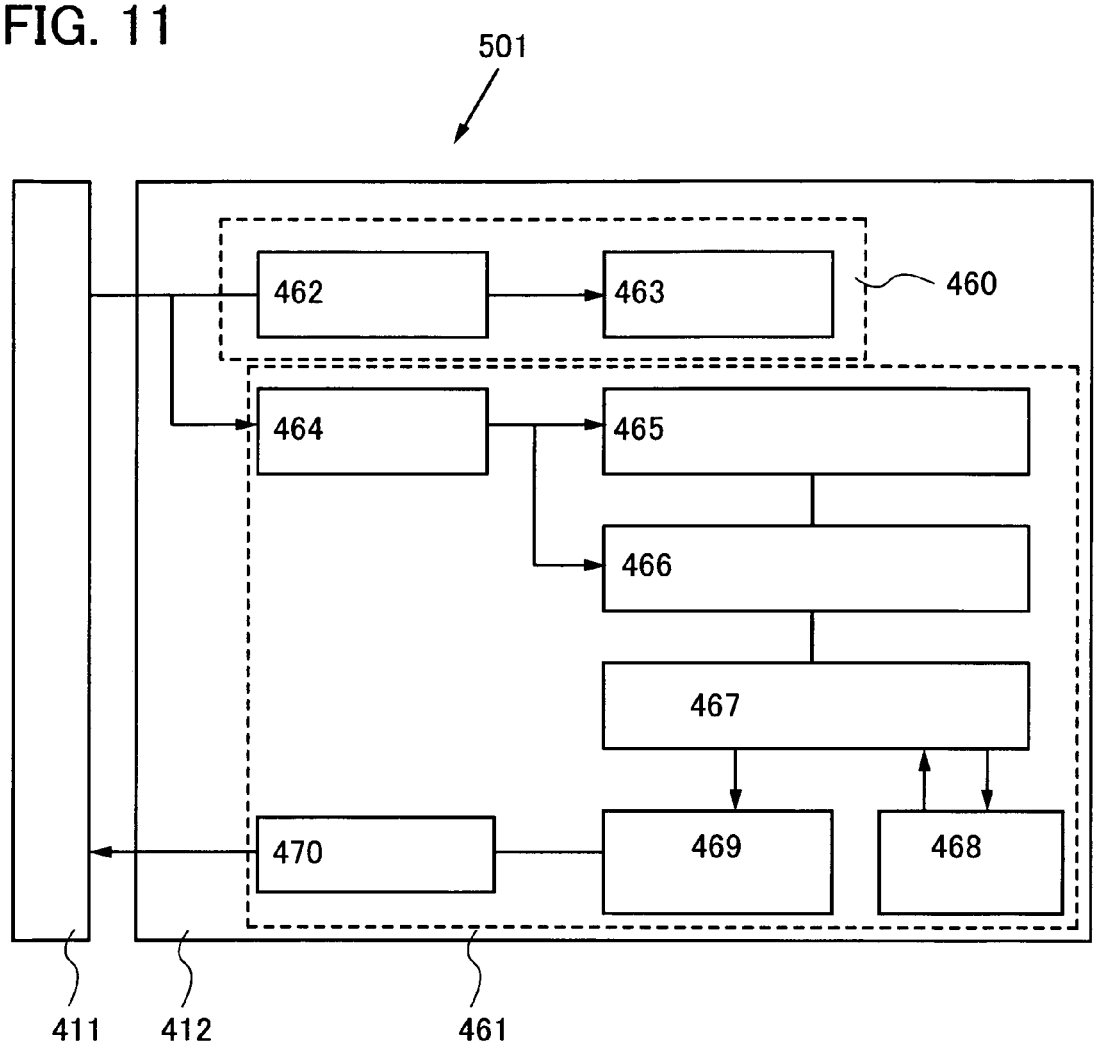
FIG. 11 is a diagram illustrating a semiconductor device of the present invention.

First, a circuit structure example of an RFID 501, which is one of the semiconductor devices of the present invention, is described. FIG. 11 shows a circuit block diagram of the RFID 501.

The RFID 501 in FIG. 11 conforms to specifications of ISO 15693 of the International Organization for Standardization, and it is a vicinity type, and has a communication signal frequency of 13.56 MHz. Further, reception only responds to a data reading instruction, data transmission rate in transmission is about 13 kHz, and the Manchester code is used for a data encoding format.

A circuit portion 412 of the RFID 501 is roughly separated into a power supply portion 460 and a signal processing portion 461. The power supply portion 460 includes a rectifying circuit 462 and a storage capacitor 463. Further, the power supply portion 460 may be provided with a protection circuit portion (also called a limiter circuit) to protect the internal circuit when the amount of electric power received by an antenna 411 is too large, and a protection circuit control circuit portion to control whether or not to operate the protection circuit portion. By providing the circuit portion, a malfunction can be prevented, which is caused by receiving the large amount of electric power by the RFID under the situation or the like in which a communication distance between the RFID and a communication instrument is extremely short. Thus, reliability of the RFID can be improved. That is, the RFID can be normally operated without degradation of an element in the RFID or destruction of the RFID itself.

Here, a communication instrument may have a means for transmitting and receiving information to/from the RFID by wireless communication, and for example, a reader which reads information, a reader/writer having a function of reading and a function of writing, and the like can be given. Further, a mobile phone, a computer, or the like having one of or both the function of reading and the function of writing is also included.

The rectification circuit 462 rectifies a carrier wave received by the antenna 411 and generates direct-current voltage. The storage capacitor 463 smoothes the direct-current voltage generated in the rectification circuit 462. The direct-current voltage generated in the power supply portion 460 is supplied to each circuit of the signal processing portion 461 as power supply voltage.

The signal processing portion 461 includes a demodulation circuit 464, a clock generation/correction circuit 465, a recognition/determination circuit 466, a memory controller 467, a mask ROM 468, an encoding circuit 469, and a modulation circuit 470.

The demodulation circuit 464 is a circuit that demodulates a signal received by the antenna 411. The received signal that is demodulated in the demodulation circuit 464 is input to the clock generation/correction circuit 465 and the recognition/determination circuit 466.

The clock generation/correction circuit 465 generates a clock signal that is necessary for operating the signal processing portion 461, and also has a function of correcting the clock signal. For example, the clock generation/correction circuit 465 includes a voltage controlled oscillator circuit (hereinafter referred to as "VCO circuit"), and turns an output from the VCO circuit into a feedback signal, makes a phase comparison with a supplied signal, and adjusts an output signal by negative feedback so that the feedback signal and a signal that is input are each in a certain phase.

The recognition/determination circuit 466 recognizes and determines an instruction code. The instruction code that is recognized and determined by the recognition/determination circuit 466 is an end-of-frame (EOF) signal, a start-of-frame (SOF) signal, a flag, a command code, a mask length, a mask value, or the like. Further, the recognition/determination circuit 466 has a cyclic redundancy check (CRC) function that identifies a transmission error.

The memory controller 467 reads data from a mask ROM based on a signal processed by the recognition/determination circuit 466. Further, an ID or the like is stored in the mask ROM 468. By mounting the mask ROM 468, the RFID 501 is formed to be dedicated to reading, so that replication or falsification is impossible. Paper which is prevented from forgery can be provided by embedding the RFID 501 dedicated to reading in paper.

The encoding circuit 469 encodes data that is read from the mask ROM 468 by the memory controller 467. The encoded data is modulated in the modulation circuit 470. The data modulated in the modulation circuit 470 is transmitted from the antenna 411 as data signals on a carrier wave.

Next, usage examples of an RFID are described. An RFID of the present invention can be used for various paper media and film media. In particular, the RFID of the present invention can be used for various paper media for which forgery prevention is necessary. The paper media are, for example, banknotes, family registers, residence certificates, passports, licenses, identification cards, membership cards, expert opinions in writing, patient's registration cards, commuter passes, promissory notes, checks, carriage notes, cargo certificates, warehouse certificates, stock certificates, bond certificates, gift certificates, tickets, deeds of mortgage, and the like.

Further, by implementing the present invention, a lot of information, more information than that which is visually shown on a paper medium, can be held in the paper medium or the film medium. Accordingly, by applying the RFID of the present invention to a product label or the like, electronic systemization of merchandise management or prevention of product theft can be realized. Usage examples of paper according to the present invention are described below with reference to FIGS. 12A to 12E.

Figure 12A:
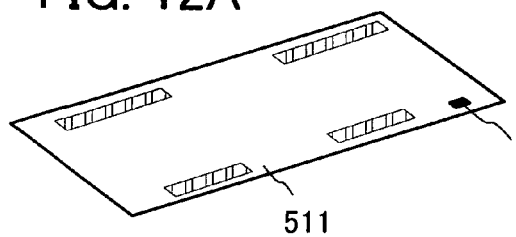
FIGS. 12A to 12E are perspective views each illustrating an application example of a semiconductor device of the present invention.
Figure 12B:
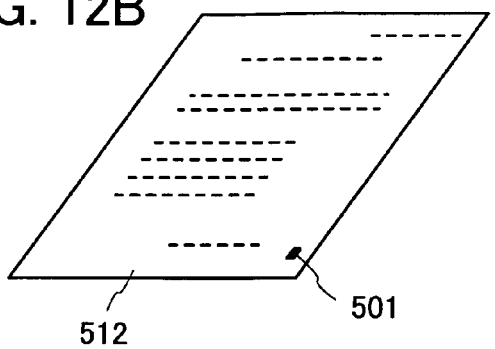

FIG. 12A is an example of a bearer bond 511 using paper embedded with an RFID 501 of the present invention. The bearer bond 511 includes a stamp, a ticket, an admission ticket, a gift certificate, a book coupon, a stationery coupon, a beer coupon, a rice coupon, various gift coupons, various service coupons, and the like, but of course, the bearer bond 511 is not limited thereto. Also, FIG. 12B is an example of a certificate 512 using paper embedded with the RFID 501 of the present invention (for example, a residence certificate or a family register).

Figure 12C:
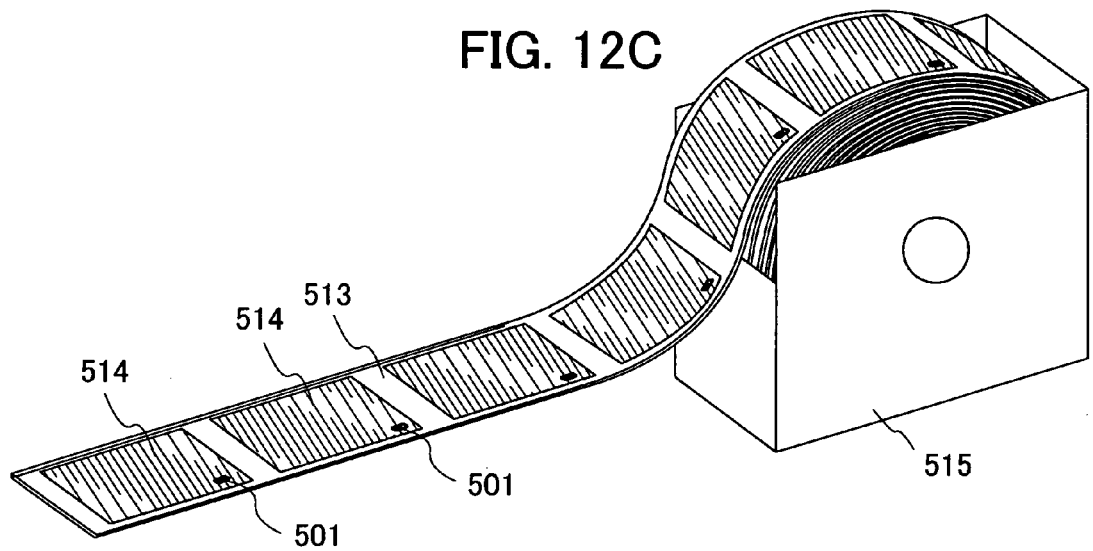

FIG. 12C is an example of applying the RFID of the present invention as a label. A label (ID sticker) 514 is formed of the paper embedded with the RFID 501, over a label base (separate paper) 513. The label 514 is stored in a box 515. On the label 514, information regarding a product or a service (such as product name, brand, trademark, trademark owner, seller, or manufacturer) is printed. In addition, since a unique ID number of the product (or a category of the product) is stored in the RFID 501, forgery, infringement of intellectual property rights such as a trademark right or a patent right, and illegal activity such as unfair competition can be spotted easily. The RFID 501 can be input with a large amount of information that cannot all be written on a container or a label of the product, such as the product's area of production, area of sales, quality, raw material, effect, use, quantity, shape, price, production method, usage method, time of production, time of use, expiration date, instruction manual, and intellectual property information relating to the product, for example. Accordingly, a transactor or a consumer can access such information with a simple communication instrument. Further, the information can easily be rewritten, erased, or the like on a producer side, but cannot be rewritten, erased or the like on a transactor or consumer side.

Figure 12D:
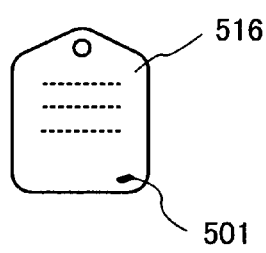
Figure 12E:
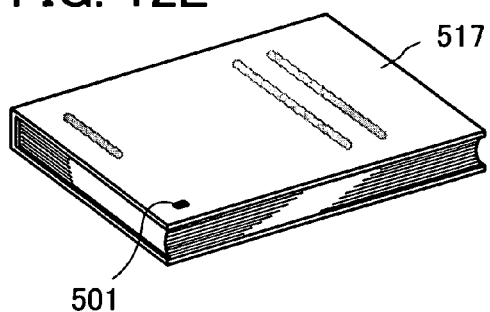

FIG. 12D shows a tag 516 formed of paper or a film which is embedded with the RFID 501. By manufacturing a tag 516 with the paper or film which is embedded with the RFID 501, the tag can be manufactured less expensively than a conventional ID tag using a plastic chassis. FIG. 12E shows a book 517 using the paper of the present invention for a cover, and the RFID 501 is embedded in the cover.

By attaching to the product the label 514 or the tag 516 which are equipped with an RFID which is an example of a semiconductor device of the present invention, merchandise management becomes easy. For example, when the product is stolen, the perpetrator can be spotted quickly by following a route of the product. In this manner, by using the RFID of the present invention for an ID tag, historical management of the product's raw material, area of production, manufacturing and processing, distribution, sales, and the like, as well as tracking inquiry becomes possible. That is, the product becomes traceable. Further, by the present invention, a tracing management system of the product can be introduced at lower cost than before.

An RFID which is an example of a semiconductor device of the present invention is not easily destroyed by local pressure. Accordingly, a paper medium and a film medium each having an RFID which is an example of a semiconductor device of the present invention can be curved in a process such as attachment or setting, leading to improvement of treatment efficiency. Further, since information can be written with a writing material to a paper medium or a film medium each having an RFID which is an example of a semiconductor device of the present invention, the range of uses is increased.

Next, a structure of a memory device which is one mode of a semiconductor device of the present invention is described below. Here, description is made by using a nonvolatile memory device as a typical example of a memory device.

Figure 13:
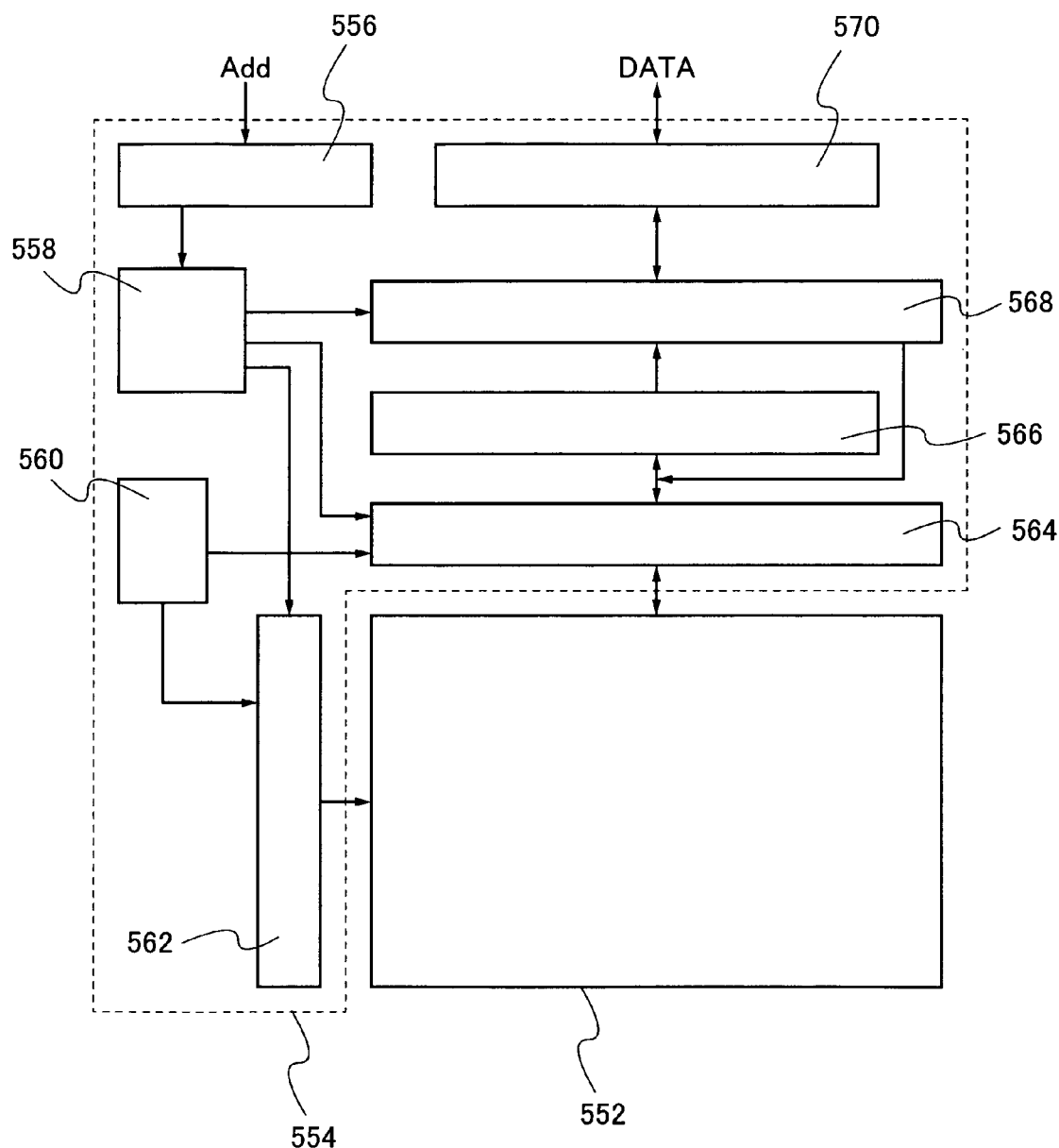
FIG. 13 is a diagram illustrating a semiconductor device of the present invention.

FIG. 13 shows an example of a circuit block diagram of a nonvolatile semiconductor memory device. The nonvolatile semiconductor memory device includes a memory cell array 552 and a peripheral circuit 554 which are formed over the same element substrate. The memory cell array 552 has a nonvolatile memory element as described in Embodiment Mode 1. A structure of the peripheral circuit 554 is as described below.

A row decoder 562 for selecting a word line and a column decoder 564 for selecting a bit line are provided around the memory cell array 552. An address is sent to a control circuit 558 through an address buffer 556, and an inner row address signal and an inner column address signal are transferred to the row decoder 562 and the column decoder 564, respectively.

Potential obtained by boosting power supply potential is used for writing and erasing of data. Therefore, a booster circuit 560 controlled by the control circuit 558 according to an operation mode is provided. Output of the booster circuit 560 is supplied to a word line or a bit line through the row decoder 562 and the column decoder 564. Data output from the column decoder 564 is input to a sense amplifier 566. Data read by the sense amplifier 566 is retained in a data buffer 568. Data retained in the data buffer 568 is accessed randomly by control by the control circuit 558, and is output through a data input/output buffer 570. Writing data is once retained in the data buffer 568 through the data input/output buffer 570 and is transferred to the column decoder 564 by control by the control circuit 558.

As described above, in the nonvolatile semiconductor memory device, potential that differs from the power supply potential is necessary to be used in the memory cell array 552. Therefore, it is desirable that at least the memory cell array 552 and the peripheral circuit 554 be electrically insulated and isolated. In this case, when a nonvolatile memory element and a transistor of a peripheral circuit are formed using a single-crystal semiconductor layer formed over an insulating surface, insulation and isolation can be easily performed. Accordingly, a nonvolatile semiconductor memory device with no malfunction and low power consumption can be obtained.

Embodiment Mode 6

This embodiment mode describes an electronic device using a semiconductor device of the present invention.

As electronic devices to which a semiconductor device of the present invention is applied, cameras such as video cameras or digital cameras, goggle displays (head mounted displays), navigation systems, audio reproducing devices (e.g., car audio or audio component sets), computers, game machines, portable information terminals (e.g., mobile computers, mobile phones, portable game machines, or electronic books), and image reproducing devices provided with storage media (specifically, a device for reproducing the content of a storage medium such as a DVD (Digital Versatile Disc) and having a display for displaying the reproduced image) can be given. FIGS. 14A to 14E show specific examples of such electronic devices.

Figure 14A:
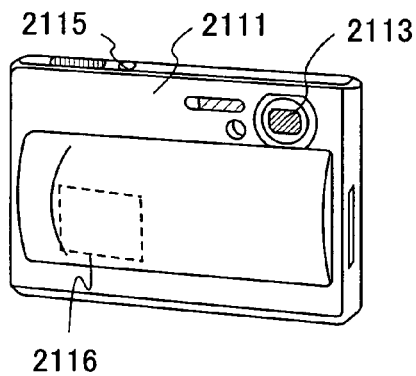
FIGS. 14A to 14E are views each illustrating an electronic device to which a semiconductor device of the present invention can be applied.
Figure 14B:
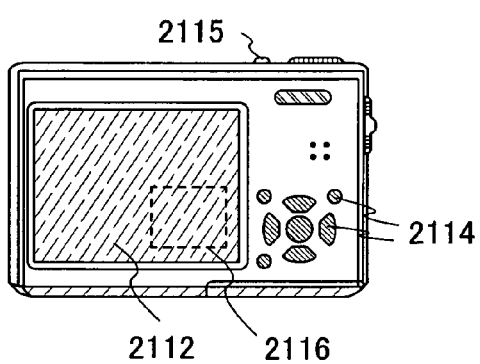

FIGS. 14A and 14B show digital cameras. FIG. 14B shows a rear side of FIG. 14A. This digital camera includes a housing 2111, a display portion 2112, a lens 2113, operating keys 2114, a shutter button 2115, and the like. A semiconductor device 2116 of the present invention which has a function as a storage device, an MPU, an image sensor, or the like is provided inside the housing 2111.

Figure 14C:
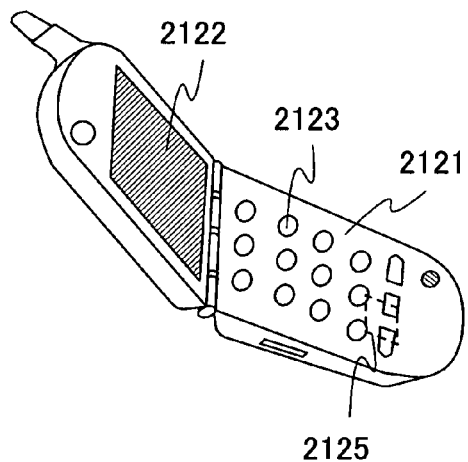

FIG. 14C shows a mobile phone which is one typical example of a portable terminal. This mobile phone includes a housing 2121, a display portion 2122, operating keys 2123, and the like. A semiconductor device 2125 of the present invention which has a function as a storage device, an MPU, an image sensor, or the like is provided inside the mobile phone.

Figure 14D:
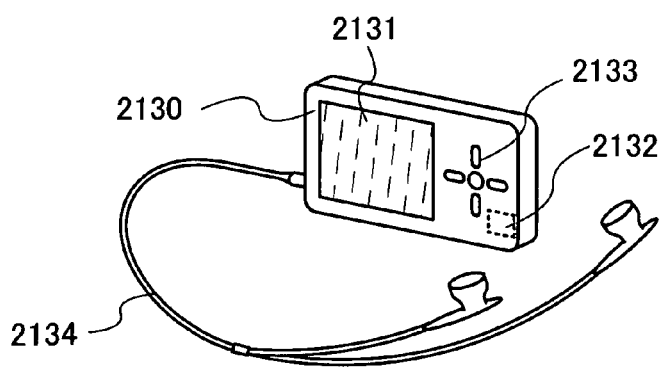

FIG. 14D shows a digital player which is one typical example of an audio device. The digital player shown in FIG. 14D includes a main body 2130, a display portion 2131, a semiconductor device 2132 of the present invention which has a function as a storage device, an MPU, an image sensor, or the like, an operating portion 2133, a pair of earphones 2134, and the like.

Figure 14E:
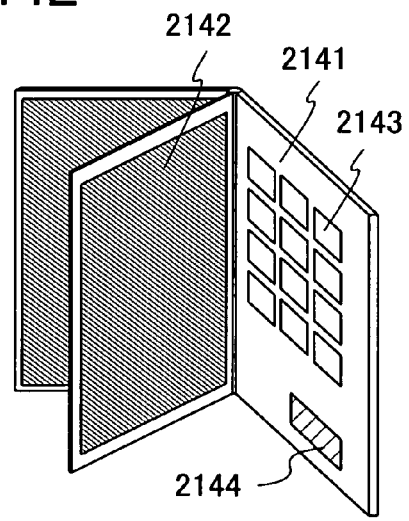

FIG. 14E shows an e-book device (also called an electronic paper). This e-book device includes a main body 2141, a display portion 2142, operating keys 2143, and a semiconductor device 2144 of the present invention which has a function as a storage device, an MPU, an image sensor, or the like. In addition, a modem may be built into the main body 2141, or a structure capable of wireless data transmission and reception may be employed.

In a manner described above, the applicable range of the semiconductor device of the present invention is so wide that the semiconductor device can be applied to other electronic devices.

This application is based on Japanese Patent Application serial no. 2007-079264 filed with Japan Patent Office on Mar. 26, 2007, the entire contents of which are hereby incorporated by reference.

What is claimed is:

1. A method of manufacturing a semiconductor device, comprising the steps of:
providing a fibrous body over an element substrate, wherein the element substrate has an active element;
applying a composition containing an organic resin over the element substrate; and
forming a sealing layer including the fibrous body and the organic resin by heating the element substrate,
wherein the element substrate is formed using an SOI substrate.

2. The method of manufacturing a semiconductor device according to claim 1, wherein the fibrous body is impregnated with the organic resin.

3. The method of manufacturing a semiconductor device according to claim 1 further comprising a step of forming an insulating layer which covers the active element.

4. The method of manufacturing a semiconductor device according to claim 1 further comprising a step of forming an antenna over the element substrate.

5. The method of manufacturing a semiconductor device according to claim 1, wherein the active element is one or more of a MOS transistor, a nonvolatile memory element, and a diode.

6. The method of manufacturing a semiconductor device according to claim 1, wherein the fibrous body comprises glass fiber.

7. The method of manufacturing a semiconductor device according to claim 1, wherein the organic resin is a thermosetting resin.

8. A method of manufacturing a semiconductor device, comprising the steps of:
providing a first fibrous body over a first surface of an element substrate, wherein the element substrate has an active element;
applying a first composition containing a first organic resin from above the first fibrous body and the element substrate so that the first fibrous body is impregnated with the first organic resin; and
forming a first sealing layer including the first fibrous body and the first organic resin by heating the element substrate, after applying the first composition,
wherein the element substrate is formed using an SOI substrate.

9. The method of manufacturing a semiconductor device according to claim 8 further comprising a step of forming an insulating layer which covers the active element.

10. The method of manufacturing a semiconductor device according to claim 8 further comprising a step of forming an antenna over the element substrate.

11. The method of manufacturing a semiconductor device according to claim 8, wherein the active element is one or more of a MOS transistor, a nonvolatile memory element, and a diode.

12. The method of manufacturing a semiconductor device according to claim 8, wherein the first fibrous body comprises glass fiber.

13. The method of manufacturing a semiconductor device according to claim 8 further comprising the steps of:
providing a second fibrous body over a second surface of the element substrate, the second surface opposed to the first surface of the element substrate;
applying a second composition containing a second organic resin to the second fibrous body and the element substrate so that the second fibrous body is impregnated with the second organic resin; and
forming a second sealing layer including the second fibrous body and the second organic resin by heating the element substrate, after applying the second composition.

14. The method of manufacturing a semiconductor device according to claim 13, wherein the second fibrous body comprises glass fiber.

15. A method of manufacturing a semiconductor device, comprising the steps of:
forming a first organic resin layer over a first surface of an element substrate, wherein the element substrate has an active element;
providing a first fibrous body on the first organic resin layer and the element substrate so that the first fibrous body is impregnated with a first organic resin of the first organic resin layer; and
forming a first sealing layer including the first fibrous body and the first organic resin by heating the element substrate, after providing the first fibrous body,
wherein the element substrate is formed using an SOI substrate.

16. The method of manufacturing a semiconductor device according to claim 15 further comprising a step of forming an insulating layer which covers the active element.

17. The method of manufacturing a semiconductor device according to claim 15 further comprising a step of forming an antenna over the element substrate.

18. The method of manufacturing a semiconductor device according to claim 15, wherein the active element is one or more of a MOS transistor, a nonvolatile memory element, and a diode.

19. The method of manufacturing a semiconductor device according to claim 15, wherein the first fibrous body comprises glass fiber.

20. The method of manufacturing a semiconductor device according to claim 15 further comprising the steps of:
   forming a second organic resin layer over a second surface of the element substrate, the second surface opposed to the first surface of the element substrate;
   providing a second fibrous body on the second organic resin layer and the element substrate so that the second fibrous body is impregnated with a second organic resin of the second organic resin layer; and
   forming a second sealing layer including the second fibrous body and the second organic resin by heating the element substrate, after providing the second fibrous body.

21. The method of manufacturing a semiconductor device according to claim 20, wherein the second fibrous body comprises glass fiber.

22. A method of manufacturing a semiconductor device, comprising the steps of:
   providing a first fibrous body over a first surface of an element substrate, wherein the element substrate has an active element and a first wiring;
   applying a first composition containing a first organic resin from above the first fibrous body and the element substrate so that the first fibrous body is impregnated with the first organic resin;
   forming a first sealing layer including the first fibrous body and the first organic resin by heating the element substrate, after applying the first composition;
   forming a first connection terminal connected to the first wiring in a first opening of the first sealing layer; and
   bonding a first substrate having a first antenna to the first sealing layer so that the first connection terminal and the first antenna are electrically connected to each other.

23. The method of manufacturing a semiconductor device according to claim 22 further comprising the steps of:
   providing a second fibrous body over a second surface of the element substrate, the second surface opposed to the first surface of the element substrate;
   applying a second composition containing a second organic resin to the second fibrous body and the element substrate so that the second fibrous body is impregnated with the second organic resin; and
   forming a second sealing layer including the second fibrous body and the second organic resin by heating the element substrate, after applying the second composition.

24. The method of manufacturing a semiconductor device according to claim 23 further comprising the steps of:
   forming a second opening so that part of a second wiring formed in the element substrate is exposed;
   forming a second connection terminal connected to the second wiring in the second opening of the second sealing layer; and
   bonding a second substrate having a second antenna to the second sealing layer so that the second connection terminal and the second antenna are electrically connected to each other.

25. A method of manufacturing a semiconductor device, comprising the steps of:
   forming a first organic resin layer over a first surface of an element substrate, wherein the element substrate has an active element and a first wiring;
   providing a first fibrous body on the first organic resin layer and the element substrate so that the first fibrous body is impregnated with a first organic resin of the first organic resin layer;
   forming a first sealing layer including the first fibrous body and the first organic resin by heating the element substrate, after providing the first fibrous body;
   forming a first connection terminal connected to the first wiring in a first opening of the first organic resin layer; and
   bonding a first substrate having a first antenna to the first sealing layer so that the first connection terminal and the first antenna are electrically connected to each other.

26. The method of manufacturing a semiconductor device according to claim 25 further comprising the steps of:
   forming a second organic resin layer over a second surface of the element substrate;
   providing a second fibrous body on the second organic resin layer and the element substrate so that the second fibrous body is impregnated with a second organic resin of the second organic resin layer; and
   forming a second sealing layer including the second fibrous body and the second organic resin by heating the element substrate, after providing the second fibrous body.

27. The method of manufacturing a semiconductor device according to claim 26 further comprising the steps of:
   forming a second opening so that part of a second wiring formed in the element substrate is exposed;
   forming a second connection terminal connected to the second wiring in the second opening of the second organic resin layer; and
   bonding a second substrate having a second antenna to the second sealing layer so that the second connection terminal and the second antenna are electrically connected to each other.

* * * * *